United States Patent
Borukhov

(10) Patent No.: US 11,309,329 B2
(45) Date of Patent: Apr. 19, 2022

(54) THREE-DIMENSIONAL NOR-TYPE MEMORY DEVICE AND METHOD OF MAKING THE SAME

(71) Applicant: SANDISK TECHNOLOGIES LLC, Addison, TX (US)

(72) Inventor: Hanan Borukhov, Rehovot (IL)

(73) Assignee: SANDISK TECHNOLOGIES LLC, Addison, TX (US)

(*) Notice: Subject to any disclaimer, the term of this patent is extended or adjusted under 35 U.S.C. 154(b) by 264 days.

(21) Appl. No.: 16/778,804

(22) Filed: Jan. 31, 2020

(65) Prior Publication Data

US 2020/0168630 A1 May 28, 2020

Related U.S. Application Data

(63) Continuation of application No. 15/966,391, filed on Apr. 30, 2018, now Pat. No. 10,593,692.

(51) Int. Cl.
*H01L 27/11582* (2017.01)
*H01L 29/08* (2006.01)
(Continued)

(52) U.S. Cl.
CPC .. *H01L 27/11582* (2013.01); *H01L 21/76802* (2013.01); *H01L 21/76877* (2013.01);
(Continued)

(58) Field of Classification Search
CPC ......... H01L 27/11582; H01L 21/76802; H01L 21/76877; H01L 21/0214; H01L 21/02164; H01L 21/02271; H01L 21/31111; H01L 29/0847; H01L 29/1037; H01L 29/40117; H01L 29/792; H01L 29/36; H01L 29/513; H01L 29/518; H01L 29/7926; H01L 29/42344
(Continued)

(56) References Cited

U.S. PATENT DOCUMENTS 6,881,994 B2 4/2005 Lee et al.
9,620,514 B2 4/2017 Kai et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

*Primary Examiner* — Nduka E Ojeh
*Assistant Examiner* — Gardner W. S. Swan
(74) *Attorney, Agent, or Firm* — The Marbury Law Group PLLC

(57) ABSTRACT

A NOR-type three-dimensional memory device includes a vertically alternating stack of insulating layers and electrically conductive layers located over a substrate, and laterally alternating sequences of respective active region pillars and respective memory stack structures. Each laterally alternating sequence is electrically isolated from the electrically conductive layers by a respective blocking dielectric layer at each level of the electrically conductive layers. Each memory stack structures include a memory film and a semiconductor channel material portion that vertically extend through the vertically alternating stack. The active region pillars include an alternating sequence of source pillar and drain pillars.

8 Claims, 29 Drawing Sheets

(51) Int. Cl.
*H01L 29/792* (2006.01)
*H01L 21/768* (2006.01)
*H01L 29/10* (2006.01)
*H01L 21/28* (2006.01)
*H01L 21/311* (2006.01)
*H01L 29/51* (2006.01)
*H01L 21/02* (2006.01)
*H01L 29/36* (2006.01)

(52) U.S. Cl.
CPC ...... *H01L 29/0847* (2013.01); *H01L 29/1037* (2013.01); *H01L 29/40117* (2019.08); *H01L 29/792* (2013.01); *H01L 21/0214* (2013.01); *H01L 21/02164* (2013.01); *H01L 21/02271* (2013.01); *H01L 21/31111* (2013.01); *H01L 29/36* (2013.01); *H01L 29/513* (2013.01); *H01L 29/518* (2013.01)

(58) Field of Classification Search
USPC ........................................................ 257/324
See application file for complete search history.

(56) References Cited

U.S. PATENT DOCUMENTS

| | | | |
|---|---|---|---|
| 9,666,594 B2 | 5/2017 | Mizuno et al. | |
| 9,728,546 B2 | 8/2017 | Serov et al. | |
| 9,935,123 B2 | 4/2018 | Nishikawa et al. | |
| 9,935,124 B2 | 4/2018 | Nishikawa et al. | |
| 2002/0028541 A1 | 3/2002 | Lee et al. | |
| 2009/0096018 A1 | 4/2009 | Izumi | |
| 2014/0203346 A1 | 7/2014 | Lee | |
| 2016/0071861 A1 | 3/2016 | Serov et al. | |
| 2016/0086970 A1 | 3/2016 | Peng | |
| 2016/0358931 A1 | 12/2016 | Lee et al. | |
| 2017/0148808 A1 | 5/2017 | Nishikawa et al. | |
| 2017/0148809 A1 | 5/2017 | Nishikawa et al. | |
| 2017/0294377 A1 | 10/2017 | Dunga | |
| 2018/0040623 A1 | 2/2018 | Kanakamedala et al. | |
| 2019/0221575 A1* | 7/2019 | Dong ................ | H01L 27/11582 |
| 2019/0312050 A1* | 10/2019 | Lai ........................ | H01L 23/528 |
| 2019/0333930 A1 | 10/2019 | Borukhov | |

* cited by examiner

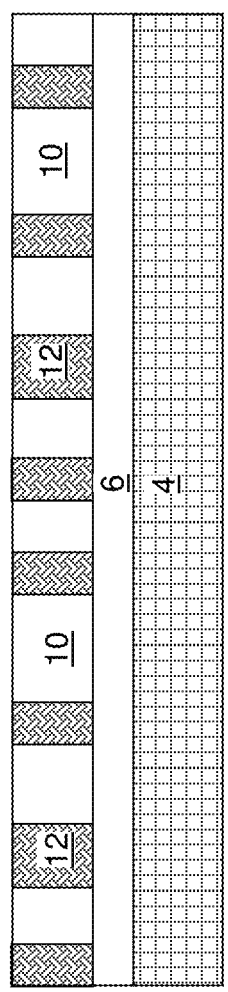

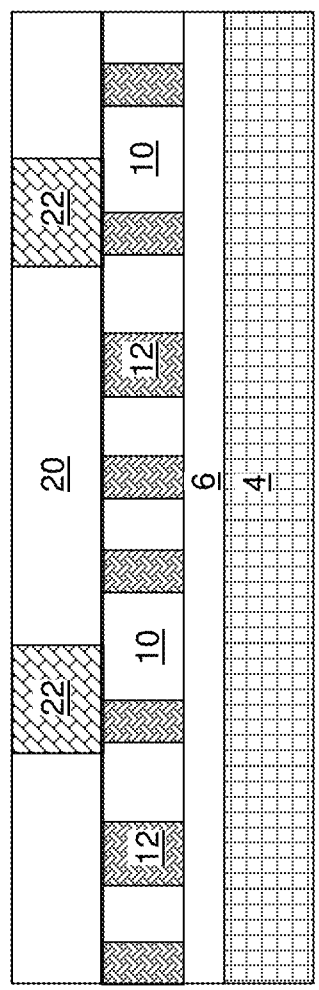

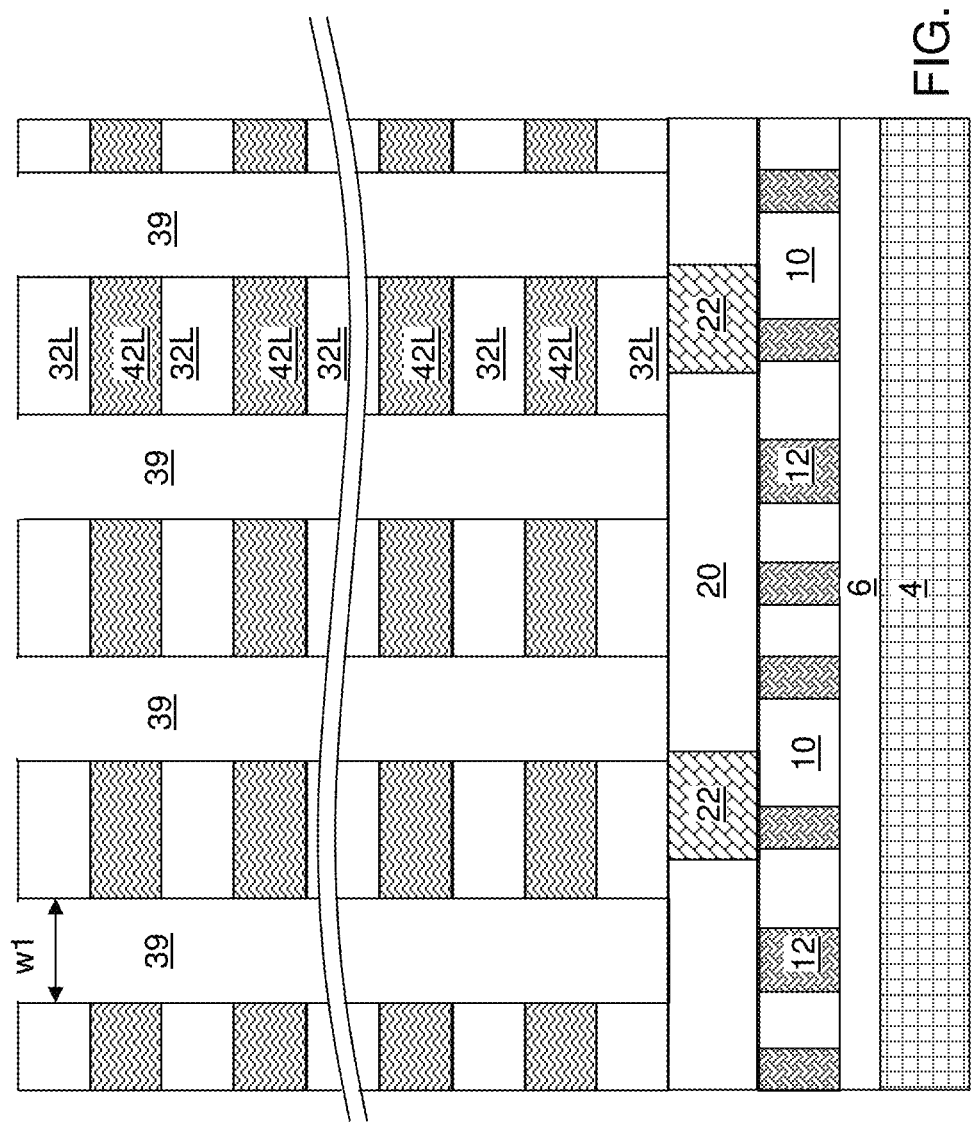

THREE-DIMENSIONAL NOR-TYPE MEMORY DEVICE AND METHOD OF MAKING THE SAME

FIELD

The present disclosure relates generally to the field of semiconductor devices, and particular to a NOR-type three-dimensional memory device and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. While NAND strings can be employed to provide a high density three-dimensional memory device, the operational speed of the NAND strings is slower than desired due to inherent delays that are present during programming and sensing.

SUMMARY

According to an aspect of the present disclosure, a three-dimensional memory device is provided, which comprises: a first vertically alternating stack of first insulating layers and first electrically conductive layers located over a substrate, and a laterally alternating sequence of active region pillars and memory stack structures vertically extending through the first vertically alternating stack. The laterally alternating sequence is electrically isolated from the first electrically conductive layers by a respective blocking dielectric layer at each level of the first electrically conductive layers. Each of the memory stack structures comprises a memory film and a semiconductor channel material portion that vertically extend at least from a bottommost one of the first electrically conductive layers to a topmost one of the first electrically conductive layers and laterally extend from a sidewall of a first neighboring active region pillar to a sidewall of a second neighboring active region pillar.

According to another aspect of the present disclosure, a method of forming a three-dimensional memory device is provided, which comprises the steps of: forming a vertically alternating sequence of continuous insulating layers and continuous sacrificial material layers; forming a plurality of line trenches laterally extending along a first horizontal direction through the vertically alternating sequence; forming a line trench fill structure within each of the line trenches by sequentially forming a charge storage layer, a semiconductor channel layer, and a dielectric core within each of the line trenches; dividing each line trench fill structure into a respective row of memory stack structures by forming active region openings therethrough; forming active region pillars in the active region opening by depositing a doped semiconductor material therein, wherein a plurality of laterally alternating sequences of active region pillars and memory stack structures are formed, each memory stack structure comprising a remaining portion of the line trench fill structures; forming backside recesses by removing the sacrificial material layers selective to the insulating layers, the memory stack structures, and the active region pillars; and depositing electrically conductive layers in remaining volumes of the backside recesses.

BRIEF DESCRIPTION OF THE DRAWINGS

FIG. 1A is a schematic vertical cross-sectional view of an exemplary structure after formation of a bottom line level dielectric layer and bottom active lines according to an embodiment of the present disclosure.

FIG. 2A is a schematic vertical cross-sectional view of the exemplary structure after formation of bottom via level dielectric layer and bottom via structures according to an embodiment of the present disclosure.

FIG. 4A is a schematic vertical cross-sectional view of the exemplary structure after formation of a plurality of line trenches laterally extending along a first horizontal direction through the vertically alternating sequence according to an embodiment of the present disclosure.

DETAILED DESCRIPTION

Figure 1B:
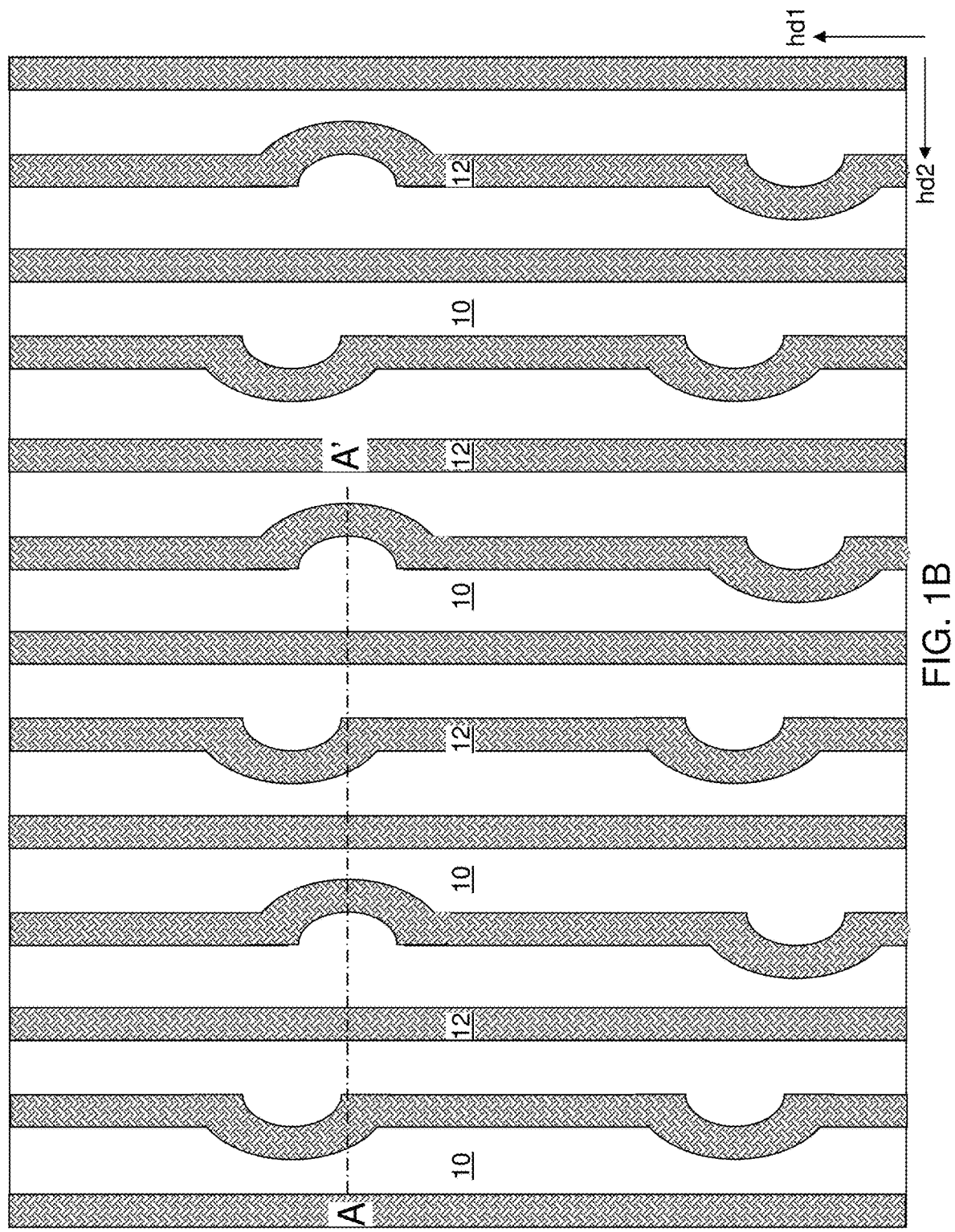
FIG. 1B is a top-down view of the exemplary structure of FIG. 1A. The vertical plane A-A' is the plane of the vertical cross-sectional view of FIG. 1A.

The embodiment of the present disclosure provides a high density NOR-type three-dimensional memory device. The memory device operational speed for programming and sensing is enhanced using a three-dimensional memory array containing NOR-type circuit configuration in which the memory cells are connected directly to a source and drain without going through adjacent memory cells for a source and/or drain connection. The bit line density for the three-dimensional memory device of the NOR-type device of the embodiments present disclosure can be comparable with, or higher than, the bit line density in NAND strings. The width to length ratio of the NOR-type memory devices (e.g., transistors) is significantly improved by orders of magnitude compared to NAND strings, thereby significantly increasing signal amplification during sensing compared to NAND type memory devices. The vertical NOR devices of the embodiments of the present disclosure have a built-in symmetry between source regions and drain regions, and is tolerant to process variations that may be introduced during manufacturing steps.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIGS. 1A and 1B, an exemplary structure according to an embodiment of the present disclosure is illustrated, which includes a substrate 4, an insulating planar spacer layer 6, and bottom active lines 12 embedded within a bottom line level insulating layer 10. The substrate 4 can include a semiconductor substrate, an insulating substrate, or a conductive substrate. The insulating planar spacer layer 6 can be a blanket layer that covers the entire top surfaces of the substrate 4 without any opening therein. For example, the insulating planar spacer layer 6 can be a silicon oxide layer having a thickness in a range from 10 nm to 300 nm, although lesser and greater thicknesses can also be employed. In one embodiment, the substrate 4 can be a silicon wafer and the insulating layer 6 can be formed by thermal oxidation of a surface portion of the silicon wafer.

The bottom line level insulating layer 10 includes a dielectric material such as silicon oxide. In one embodiment, the bottom line level insulating layer 10 can be formed over the insulating planar spacer layer 6 by deposition of a dielectric material. For example, a doped silicate glass material or an undoped silicate glass material may be deposited on the top surface of the insulating planar spacer layer 6 by plasma enhanced chemical vapor deposition. Alternatively, the bottom line level insulating layer 10 may be formed as an upper portion of an insulating material that is formed over the substrate 4. A lower portion of the insulating material that remains unpatterned can constitute the insulating planar spacer layer 6, and an upper portion of the insulating material that is patterned to embed the bottom active lines 12 can constitute the bottom line level insulating layer 10. In this case, the insulating planar spacer layer 6 and the bottom line level insulating layer 10 can have a same composition. For example, the insulating planar spacer layer 6 and the bottom line level insulating layer 10 can include thermal oxide, a doped silicate glass, or an undoped silicate glass. The thickness of the bottom line level insulating layer 10 can be in a range from 50 nm to 300 nm, although lesser and greater thicknesses can also be employed.

Line trenches that generally extend laterally along a first horizontal direction hd1 and laterally spaced apart along a second horizontal direction hd2 that is perpendicular to the first horizontal direction hd1 can be patterned through the bottom line level insulating layer 10 by lithographic methods. The line trenches can be straight or curved depending on the spacing the overlying connections. The pattern of the line trenches can be a general line and space pattern with optional modifications (e.g., curved regions) to provide sufficient electrical isolation distance for bottom via structures to be subsequently formed in an upper level. At least one electrically conductive material can be deposited in the line trenches to form bottom active lines 12. Alternatively, the bottom active lines 12 can be formed first, followed by forming layer 10 around the lines 12. The bottom active lines 12 can be source lines or drain lines (i.e., bit lines) that are subsequently electrically connected to source regions or drain regions of parallel lateral field effect transistors of vertical NOR strings to be formed. In one embodiment, the bottom active lines 12 are source lines. In another embodiment, the bottom active lines 12 are drain lines. The bottom active lines 12 can be straight or can include optional curved regions shown in FIG. 1B.

Figure 2B:
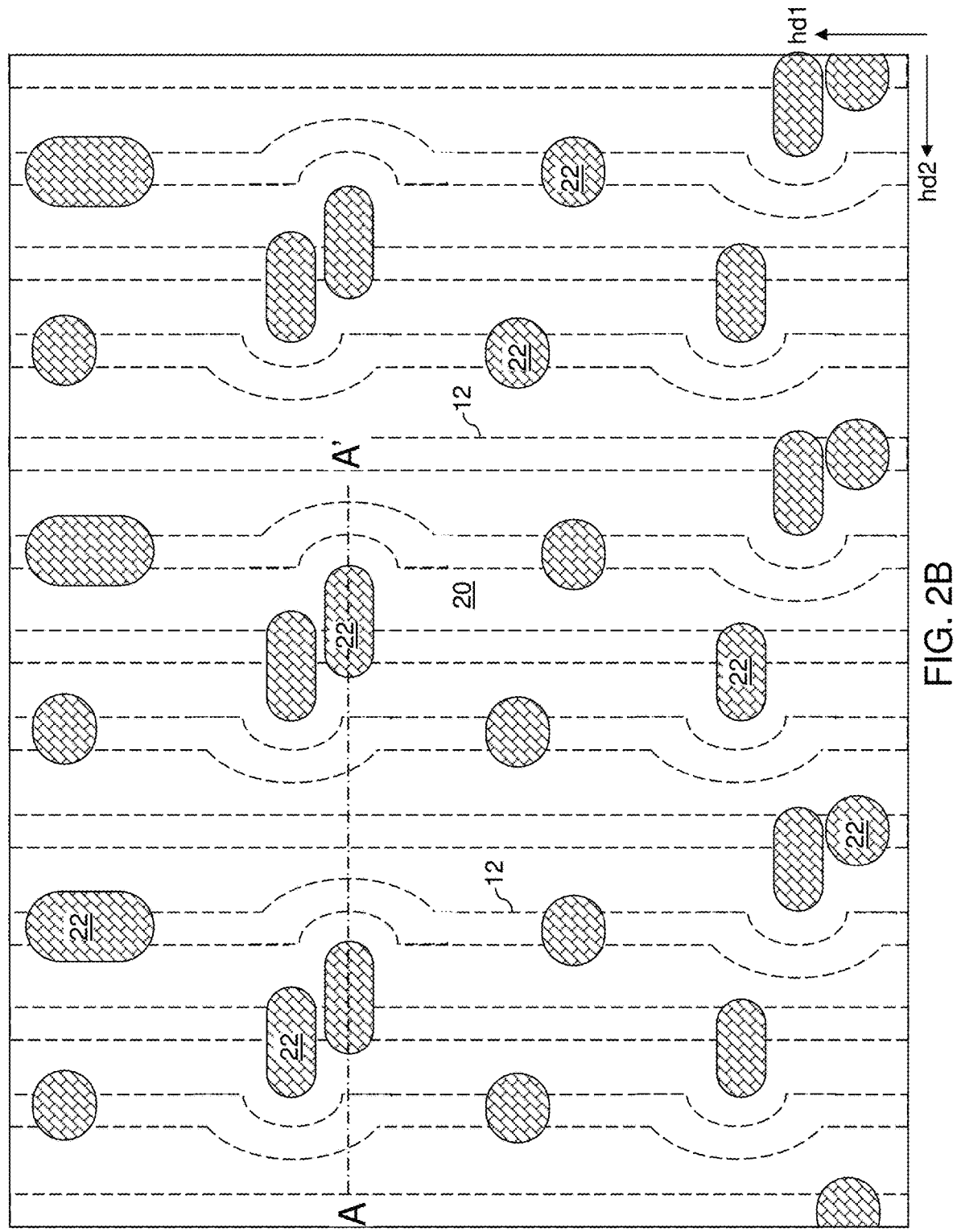
FIG. 2B is a top-down view of the exemplary structure of FIG. 2A. The vertical plane A-A' is the plane of the vertical cross-sectional view of FIG. 2A.

Referring to FIGS. 2A and 2B, bottom via structures 22 embedded within a bottom via level insulating layer 20 can be subsequently formed. The bottom via level insulating layer 20 includes a dielectric material such as silicon oxide. The bottom via level insulating layer 20 can be formed over the bottom line level insulating layer 10 by deposition of a dielectric material. For example, a doped silicate glass material or an undoped silicate glass material may be deposited on the top surface of the bottom line level insulating layer 10 by plasma enhanced chemical vapor deposition. The thickness of the bottom via level insulating layer 20 can be in a range from 50 nm to 300 nm, although lesser and greater thicknesses can also be employed.

Via cavities are formed though the bottom via level insulating layer 20 by application and patterning of a photoresist layer over the bottom via level insulating layer 20, and transferring the pattern in the photoresist layer through the bottom via level insulating layer 20 employing an anisotropic etch process. The via cavities are formed in areas in which first-type active region pillars are to be subsequently formed. The first-type active regions may be source regions or drain regions. The photoresist layer is subsequently removed, for example, by ashing. At least one conductive material is deposited in the via cavities, and excess portions of the at least one conductive material is removed from above a horizontal plane including the top surface of the bottom via level insulating layer 20. Each remaining portion of the at least one conductive material constitutes a bottom via structure 22. The shapes of the bottom via structures 22 can be selected to provide electrical contact between a respective underlying bottom active line 12 and first-type active region pillars to be subsequently formed above the bottom via level insulating layer 20. The shapes of the bottom via structures 22 can be the same or different from each other, and can have a circular or elongated (e.g., roughly elliptical) horizontal cross sectional shape. The shapes of the bottom active lines 12 and the shapes of the bottom via structures 22 can be selected to avoid electrical shorts among neighboring pairs of the bottom active lines 12.

Figure 3:
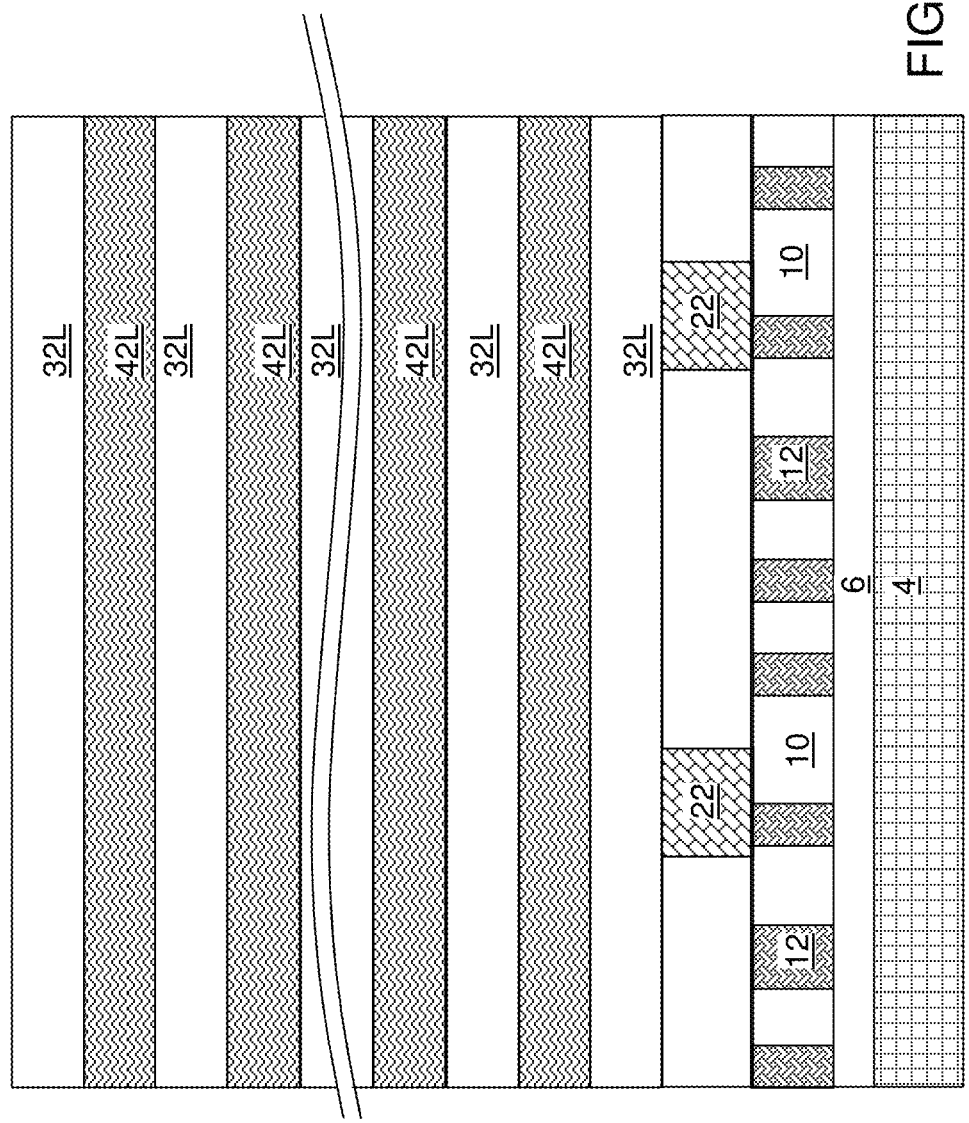
FIG. 3 is a schematic vertical cross-sectional view of the exemplary structure after formation of a vertically alternating sequence of continuous insulating layers and continuous sacrificial material layers over a substrate according to an embodiment of the present disclosure.

Referring to FIG. 3, a vertically alternating sequence of continuous insulating layers 32L and continuous sacrificial material layers 42L is formed over the top surface of the substrate 4. As used herein, a "material layer" refers to a layer including a material throughout the entirety thereof. As used herein, a vertically alternating sequence of first elements and second elements refers to a structure in which instances of the first elements and instances of the second elements alternate along a vertical direction. Each instance of the first elements that is not an end element of the vertically alternating sequence is located between two instances of the second elements, and each instance of the second elements that is not an end element of the vertically alternating sequence is located between two instances of the first elements. The first elements may have the same thickness thereamongst, or may have different thicknesses. The second elements may have the same thickness thereamongst, or may have different thicknesses. The vertically alternating sequence of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating sequence of layers. As used herein, a "continuous" element refers to an element that is formed as a single continuous structure, i.e., an element that is not formed as multiple disjoined portions.

Each continuous insulating layer 32L includes a dielectric material, i.e., an electrically insulating material. Dielectric materials that can be employed for the continuous insulating layer 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the continuous insulating layer 32L can include, and/or can consist essentially of, a silicon oxide material such as a doped silicate glass or an undoped silicate glass.

Each continuous sacrificial material layer 42L includes a sacrificial material that can be removed selective to the material of the continuous insulating layers 32L. As used herein, removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The continuous sacrificial material layers 42L may comprise an insulating material, a semiconductor material, or a conductive material. The material of the continuous sacrificial material layers 42L can be subsequently replaced with electrically conductive electrodes which can function, for example, as control gate electrodes of a vertical NAND device. Non-limiting examples of the second material include silicon nitride, an amorphous or polycrystalline semiconductor material (such as polysilicon) or a doped silicate glass material that can be removed at a higher etch rate than the material of the continuous insulating layers 32L. In one embodiment, the continuous sacrificial material layers 42L can comprise, and/or consist essentially of, silicon nitride, silicon-germanium alloy, germanium, undoped amorphous silicon, borosilicate glass, or organo-silicate glass.

The continuous insulating layers 32L and the continuous sacrificial material layers 42L can be deposited, for example, by chemical vapor deposition (CVD). For example, if silicon oxide is employed for the continuous insulating layers 32L, tetraethyl orthosilicate (TEOS) can be employed as the precursor material for the CVD process. The material of the continuous sacrificial material layers 42L can be formed, for example, CVD or atomic layer deposition (ALD).

The thicknesses of the continuous insulating layers 32L and the continuous sacrificial material layers 42L can be in a range from 20 nm to 50 nm, although lesser and greater thicknesses can be employed for each continuous insulating layer 32L and for each continuous sacrificial material layer 42L. The number of repetitions of the pairs of a continuous insulating layer 32L and a continuous sacrificial material layer 42L can be in a range from 2 to 1,024, and typically from 8 to 256, although a greater number of repetitions can also be employed. In one embodiment, each continuous sacrificial material layer 42L in the vertically alternating sequence (32L, 42L) can have a uniform thickness that is substantially invariant within each respective continuous sacrificial material layer 42L.

Stepped surfaces can be formed by patterning the vertically alternating sequence (32L, 42L) in a contact region located adjacent to a memory array region in which memory stack structures are to be subsequently formed. The stepped surfaces can be formed, for example, by forming a patterned trimmable mask layer (not shown) with an opening in the contact region, and iteratively performing a set of processing steps including an anisotropic etch process that etches a pair of a continuous insulating layer 32L and a continuous sacrificial material layer 42L and a trimming process that trims the patterned trimmable mask layer and laterally expands unmasked areas of the vertically alternating sequence (32L, 42L) that are not covered by the patterned trimmable mask layer. The stepped surfaces can extend from a bottommost layer of the vertically alternating sequence (32L, 42L) to a topmost layer of the vertically alternating sequence (32L, 42L). The patterned trimmable mask layer can be subsequently removed, for example, by ashing. A retro-stepped dielectric material portion (not shown) having a planar top surface and stepped bottom surfaces can be formed on the stepped surfaces of the vertically alternating sequence (32L, 42L).

Figure 4B:
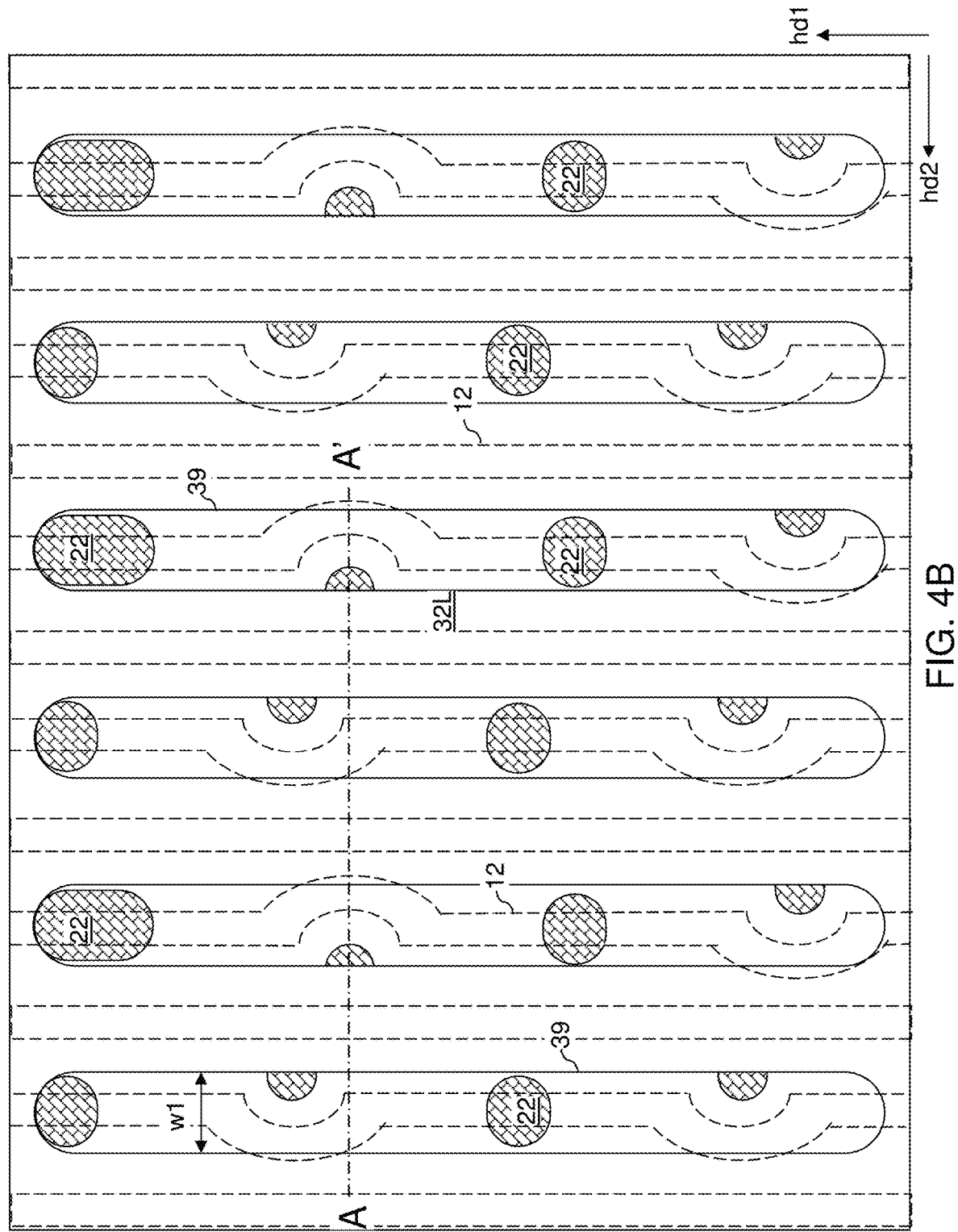
FIG. 4B is a top-down view of the exemplary structure of FIG. 4A. The vertical plane A-A' is the plane of the vertical cross-sectional view of FIG. 4A.

Referring to FIGS. 4A and 4B, a plurality of line trenches 39 are formed through the vertically alternating sequence of the continuous insulating layers 32L and the continuous sacrificial material layers 42L within the memory array region. As used herein, a "line trench" refers to a trench of which a predominant portion laterally extends along a lengthwise direction (e.g., the first horizontal direction hd1) of the trench. Corner regions and/or end regions of a line trench may have rounded shapes. Each line trench 39 can laterally extend along a direction that is parallel to the general direction of the bottom active lines 12. Each line trench 39 can have a first width w1 along a second horizontal direction hd2 that is perpendicular to the first horizontal direction hd1. In one embodiment, each of the plurality of line trenches 39 has the uniform first width w1 along the second horizontal direction hd2 between a respective pair of parallel sidewalls that extend along the first horizontal direction hd1. The first width w1 can be in a range from 30 nm to 300 nm, such as from 50 nm to 200 nm, although lesser and greater dimensions can also be employed. The lengthwise dimension, i.e., the maximum dimension along the first horizontal direction hd1, of each line trench 39 can be in a range from 300 nm to 30 microns, although lesser and greater dimensions can also be employed.

Top surfaces of the bottom via structures 22 are physically exposed at the bottom of each line trench 39. The pattern of the bottom via structures 22 can be selected such that a row of bottom via structures 22 are physically exposed at the bottom of each line trench 39 at regular intervals. The number of bottom via structures 22 within each row of bottom via structures 22 can be in a range from 4 to 4,097, although lesser and greater numbers can also be employed.

Figure 5A:
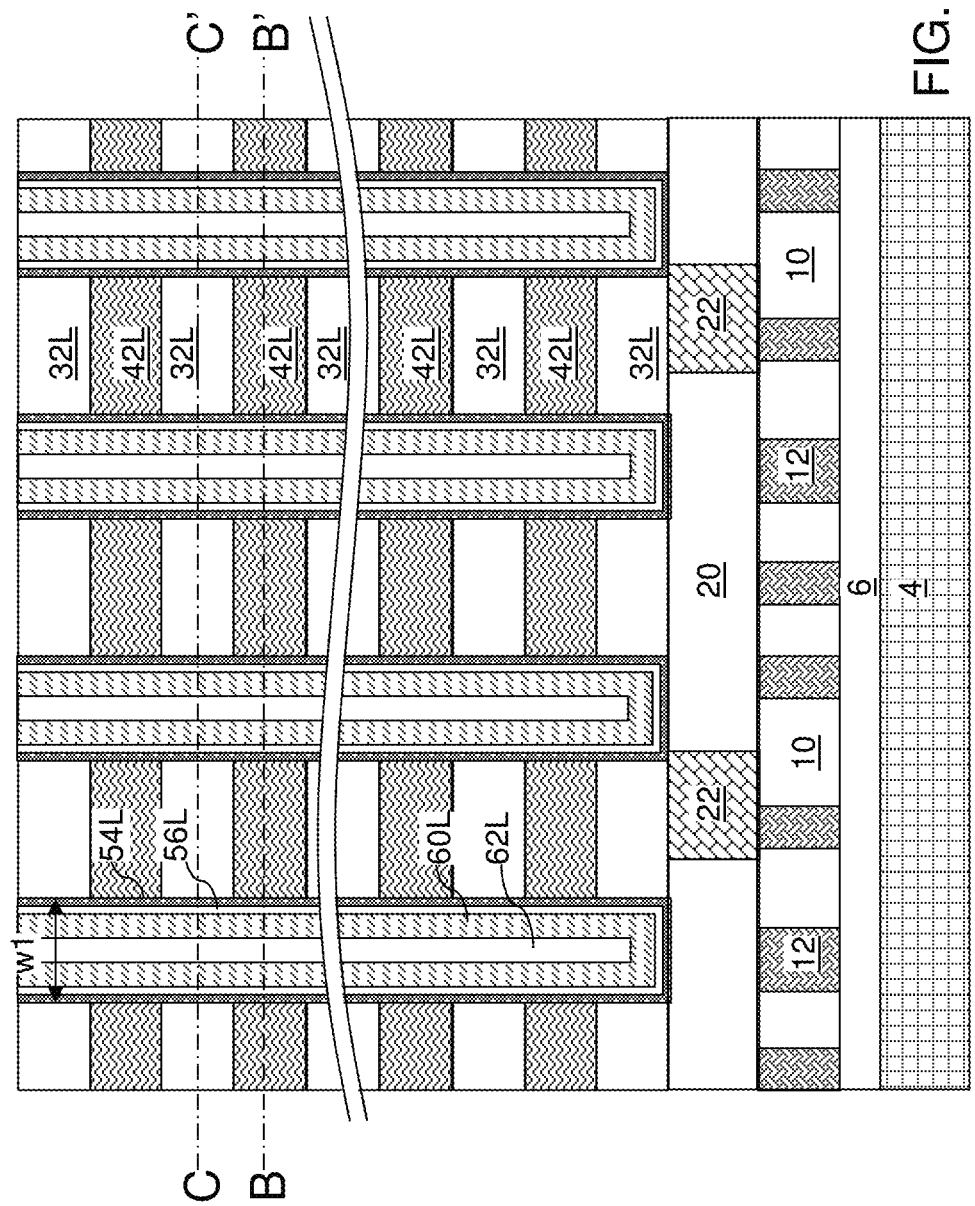
FIG. 5A is a vertical cross-sectional view of the exemplary structure after formation of line trench fill structures according to an embodiment of the present disclosure.
Figure 5B:
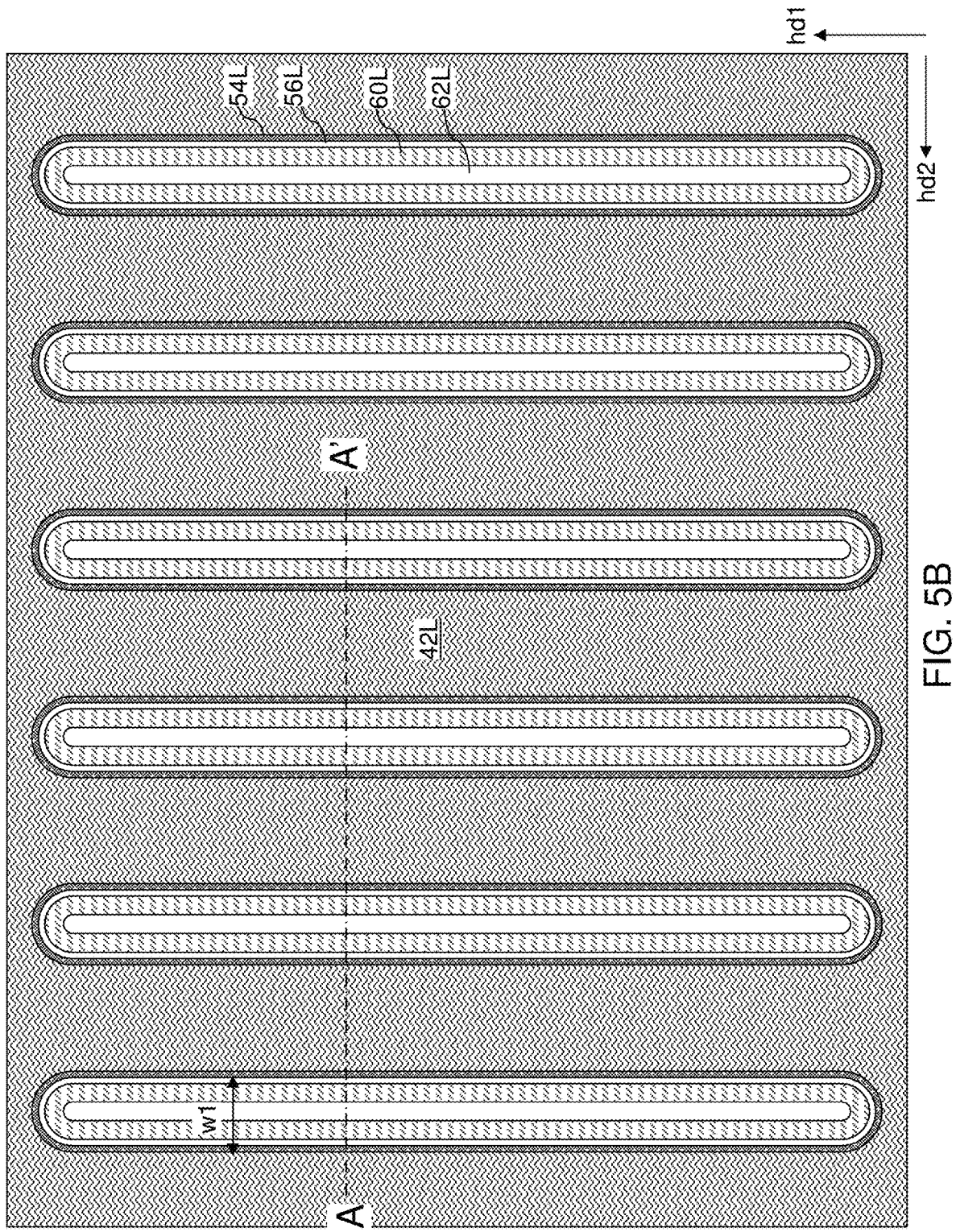
FIG. 5B is a horizontal cross-sectional view of the exemplary structure along the horizontal plane B-B' of FIG. 5A. The vertical plane A-A' is the plane of the vertical cross-sectional view of FIG. 5A.
Figure 5C:
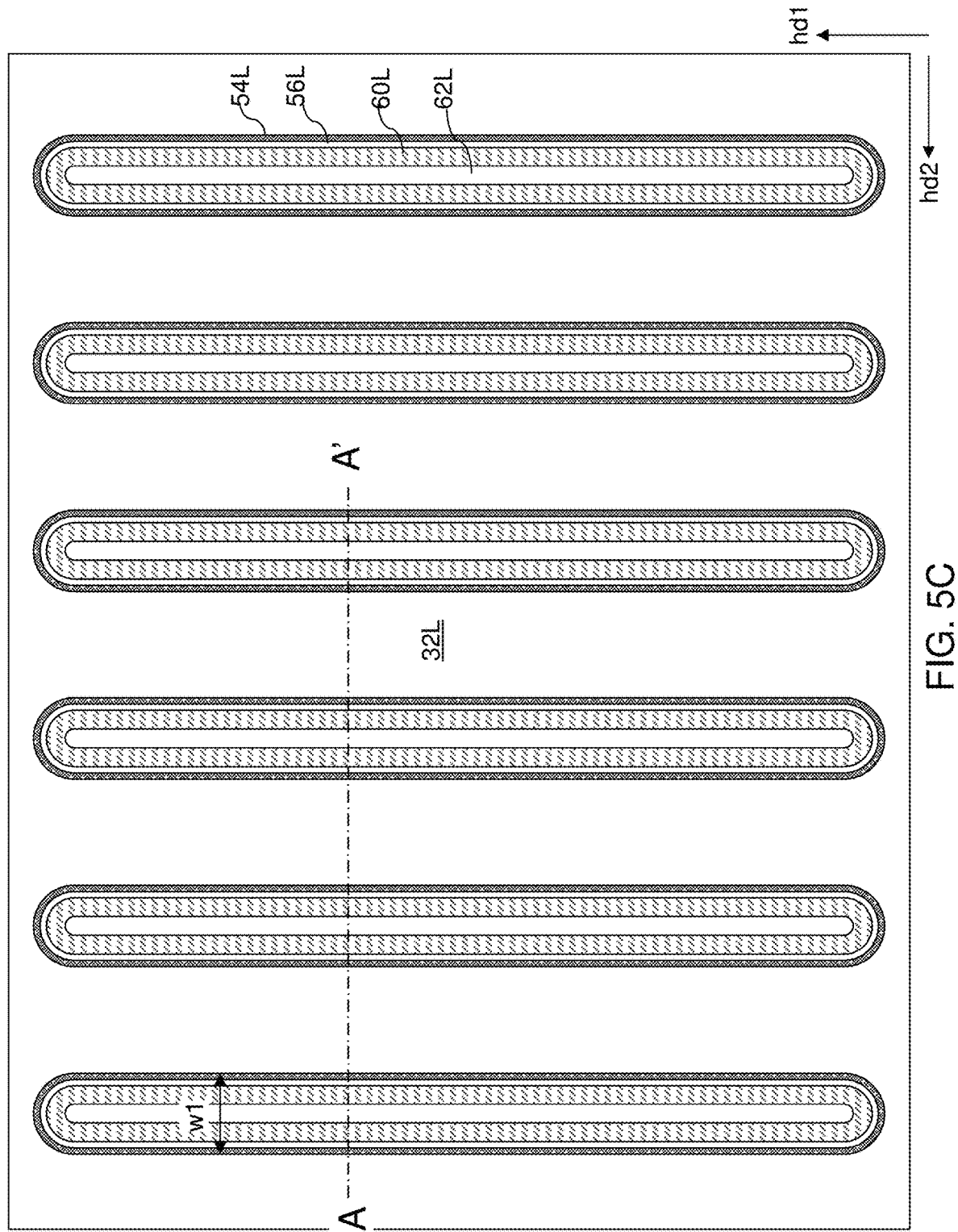
FIG. 5C is a horizontal cross-sectional view of the exemplary structure along the horizontal plane C-C' of FIG. 5A. The vertical plane A-A' is the plane of the vertical cross-sectional view of FIG. 5A.

Referring to FIGS. 5A-5C, a set of material layers can be sequentially deposited in the plurality of line trenches 39 employing conformal deposition processes. The set of material layers can include a charge storage material layer 54L, a tunneling dielectric layer 56L, a semiconductor channel layer 60L, and a dielectric material layer. A planarization process can be employed to remove horizontal portions of the set of material layers from above the horizontal plane including the top surface of a topmost continuous insulating layer 32L. Each remaining portion of the dielectric material layer constitutes an elongated dielectric core 62L that is embedded within a respective semiconductor channel layer 60L. Each contiguous set of a charge storage material layer 54L, a tunneling dielectric layer 56L, a semiconductor channel layer 60L, and an elongated dielectric core 62L constitutes a line trench fill structure (54L, 56L, 60L, 62L). If the sacrificial material layers 42L comprise the same material (e.g., silicon nitride) as the charge storage material layer 54L, then an optional "front side" blocking dielectric layer, such as silicon oxide or aluminum oxide layer, can be formed first in the line trenches 39 in contact with the outer part of the charge storage material layer 54L.

Each charge storage material layer 54L can be a layer of a dielectric charge trapping material, which can be, for example, silicon nitride. Each charge storage material layer 54L can be formed as a single charge storage layer of homogeneous composition, or can include a stack of multiple charge storage layers. The material of the charge storage material layer 54L can be deposited, for example, by chemical vapor deposition (CVD) or atomic layer deposition (ALD). The thickness of each charge storage material layer 54L can be substantially uniform throughout, and can be in a range from 2 nm to 20 nm, although lesser and greater thicknesses can also be employed.

Each tunneling dielectric layer 56L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NOR string memory device to be formed. Each tunneling dielectric layer 56L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, each tunneling dielectric layer 56L can include a stack of a first silicon oxide layer, a silicon oxynitride layer, and a second silicon oxide layer, which is commonly known as an ONO stack. In one embodiment, each tunneling dielectric layer 56L can include a silicon oxide layer that is substantially free of carbon or a silicon oxynitride layer that is substantially free of carbon. The thickness of each tunneling dielectric layer 56L can be substantially uniform throughout, and can be in a range from 2 nm to 20 nm, although lesser and greater thicknesses can also be employed.

Each semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. The semiconductor channel layers 60 can include a doped semiconductor material including electrical dopants, which may be p-type dopants or n-type dopants. The atomic concentration of the semiconductor channel layers 60 can be in a range from $1.0 \times 10^{15}/cm^3$ to $1.0 \times 10^{19}/cm^3$, such as from $1.0 \times 10^{16}/cm^3$ to $1.0 \times 10^{18}/cm^3$, although lesser and greater atomic concentrations can also be employed. In one embodiment, each semiconductor channel layer 60L includes amorphous silicon or polysilicon. The material of the semiconductor channel layers 60 can be deposited by a conformal deposition method such as low pressure chemical vapor deposition (LPCVD). The thickness of each semiconductor channel layer 60L can be substantially uniform throughout, and can be in a range from 2 nm to 50 nm, such as from 4 nm to 25 nm, although lesser and greater thicknesses can also be employed.

Each elongated dielectric core 62L includes a dielectric material such as silicon oxide. For example, the elongated dielectric cores 62L can include undoped silicate glass or doped silicate glass.

Figure 6A:
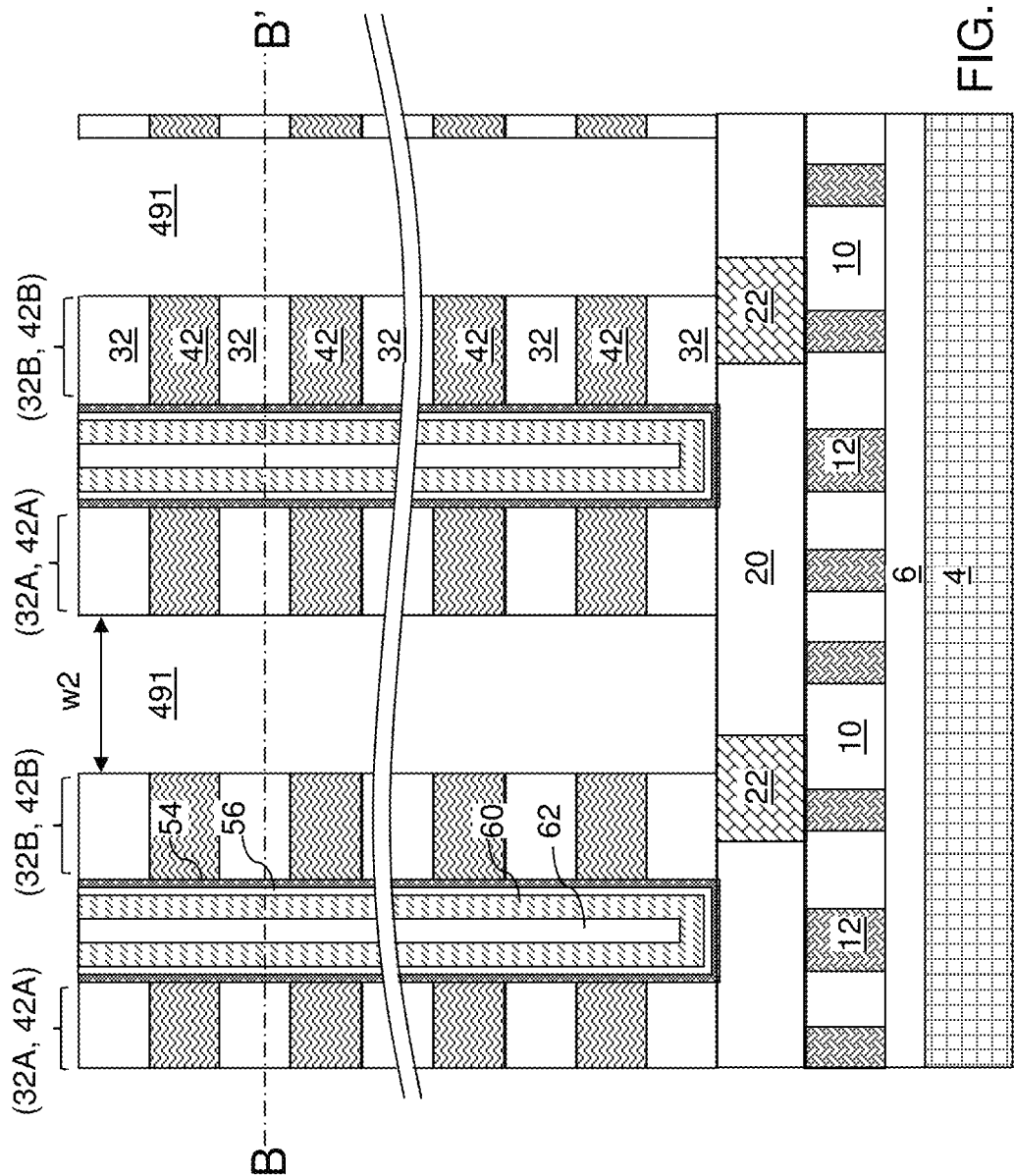
FIG. 6A is a vertical cross-sectional view of the exemplary structure after formation of active region openings according to an embodiment of the present disclosure.
Figure 6B:
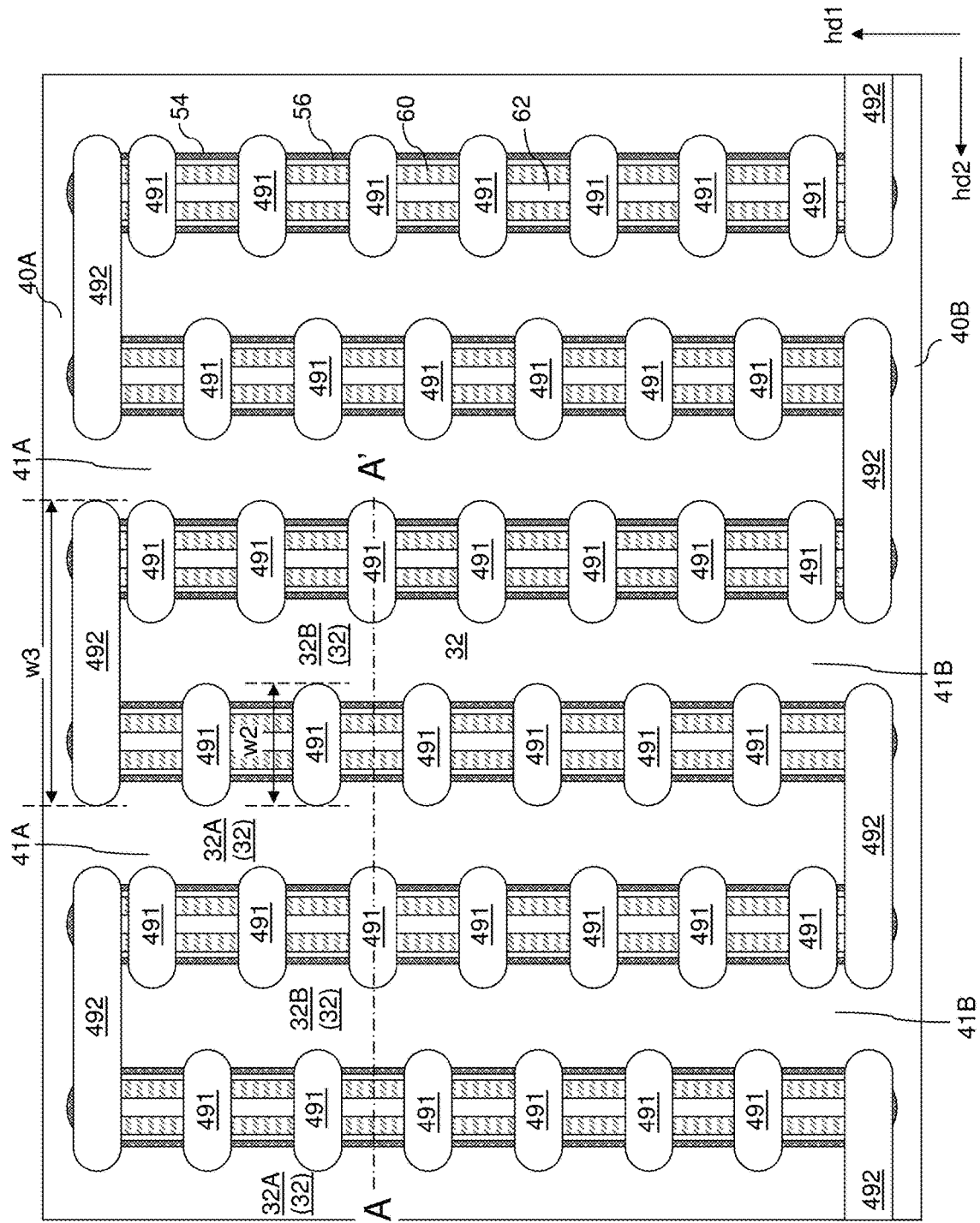
FIG. 6B is a top-down view of the exemplary structure of FIG. 6A. The vertical plane A-A' is the plane of the vertical cross-sectional view of FIG. 6A.

Referring to FIGS. 6A and 6B, active region openings (491, 492) can be formed through a respective one, or a respective pair, of the line trench fill structures (54L, 56L, 60L, 62L). Each active region opening (491, 492) cuts through at least one line trench fill structure (54L, 56L, 60L, 62L). Each line trench fill structure (54L, 56L, 60L, 62L) can be divided into a respective row of memory stack structures by forming a respective subset of the active region openings (491, 492) therethrough.

The active region openings (491, 492) include first-type active region openings 491 that cut through only a respective one of the line trench fill structures (54L, 56L, 60L, 62L) and second-type active region openings 492 that cuts through end regions of a respective neighboring pair of the line trench fill structures (54L, 56L, 60L, 62L). The first-type active region openings 491 have a second width w2 along the second horizontal direction hd2, and intersects a pair of parallel sidewalls of a respective one of the line trenches 39 that extend along the first horizontal direction hd1. The second-type active region openings 492 have a third width w3 that is greater than the sum of the spacing between a neighboring pair of line trenches 39 and twice the first width w1. At least three active region openings (491, 492) cuts through each of the plurality of line trenches 39. In one embodiment, each of the active region openings (491, 492) has a pair of straight sidewalls that extend along the second horizontal direction hd2 and having a width that is at least the first width w1, i.e., the width of each line trench 39.

The line trenches 39 can have the same length along the first horizontal direction hd1, and can be arranged as a one-dimensional array located within a rectangular area. The second-type active region openings 492 can be formed such that each second-type active region opening is formed at end portions of a respective pair of line trenches 39. The first-type active region openings 491 can be formed such that a respective row of first-type active region openings cuts through each line trench fill structure (54L, 56L, 60L, 62L). Top surfaces of the bottom via structures 22 can be physically exposed at the bottom of every other first-type active region opening 491 within each row of first-type active region openings. In one embodiment, each row of first-type active region openings 491 can be arranged as a periodic one-dimensional array extending along the first horizontal direction hd1. In this case, the average pitch of underlying bottom via structures 22 along the first horizontal direction hd1 can be twice the pitch of the first-type active region openings 491 within the row of first-type active region openings 491.

A first set of second-type active region openings 492 can be formed through one end of each line trench fill structure (54L, 56L, 60L, 62L), and a second set of second-type active region openings 492 can be formed through the other end of each line trench fill structure (54L, 56L, 60L, 62L). The first set and the second set are offset along the second horizontal direction by the pitch of the line trench fill structures (54L, 56L, 60L, 62L).

In this case, the second-type active region openings 492 divide the vertically alternating sequence of the continuous insulating layers 32L and the continuous sacrificial material layers 42L into a first in-process vertically alternating stack (32A, 42A) of first insulating layers 32A and first sacrificial material layers 42A, and a second in-process vertically alternating stack (32B, 42B) of second insulating layers 32B and second sacrificial material layers 42B. Each of the first and second insulating layers 32 (e.g., 32A and 32B) is a patterned portion of the continuous insulating layers 32L, and each of the first and second sacrificial material layers 42 (e.g., 42A and 42B) is a patterned portion of the continuous sacrificial material layers 42L. Each insulating layer 32 can have a base portion 40 that is located outside the rectangular area including the line trench fill structures (54L, 56L, 60L, 62L) and finger portions 41 that extend along the first horizontal direction hd1 and having a finger-to-finger pitch that is twice the pitch of the line trench fill structures (54L, 56L, 60L, 62L) along the second horizontal direction hd2. For example, as shown in FIG. 6B, the first in-process vertically alternating stack (32A, 42A) and the second in-process vertically alternating stack (32B, 42B) have respective base portions (40A, 40B) and finger portions (41A, 41B).

Remaining portions of the line trench fill structures (54L, 56L, 60L, 62L) include pillar structures, which are herein referred to as memory stack structures. As used herein, a "pillar structure" refers to a vertical structure having a vertical height that is greater than the horizontal width and length. Each of the memory stack structures comprises a memory film (54, 56) and a semiconductor channel material portion 60. Each memory film (54, 56) includes a lateral stack including a charge storage layer 54 and a tunneling dielectric 56. Each portion of a charge storage layer 54 that is located adjacent to a first or second sacrificial material layer 42 functions as a charge storage element after replacement of the first and second sacrificial material layers 42 with electrically conductive layers. Thus, each charge storage layer 54 can include two vertical stacks of charge storage elements.

Each charge storage layer 54 includes a U-shaped patterned strip that is a remaining portion of a charge storage material layer 54L in the vertical cross section of FIG. 6A.

Each tunneling dielectric 56 includes a U-shaped patterned strip that is a remaining portion of a tunneling dielectric layer 56L in the vertical cross section of FIG. 6A. Each memory film (54,56) and each semiconductor channel material portion 60 vertically extend at least from a bottommost one of the first and second sacrificial material layers 42 to a topmost one of the first and second sacrificial material layers 42. Further, each memory film (54,56) and each semiconductor channel material portion 60 laterally extend from a sidewall of a first neighboring active region opening (491, 492) to a sidewalls of a second neighboring active region opening (491, 492).

Each semiconductor channel material portion 60 is a patterned portion of a semiconductor channel layer 60L. Each semiconductor channel material portion 60 can be U-shaped in the vertical cross section of FIG. 6A, and can include a pair of vertically-extending semiconductor material portions and a horizontally-extending semiconductor material portion adjoined to bottom ends of the pair of vertically-extending semiconductor material portions. Each tunneling dielectric 56 contacts a respective semiconductor channel material portion 60.

Each elongated dielectric core 62L is divided into a respective plurality of dielectric pillar structures 62 upon formation of the active region openings (491, 492). Each dielectric pillar structure 62 is formed between a pair of vertically-extending parts of the semiconductor channel material portion 60, and overlies a horizontally-extending part of the respective semiconductor channel material portion 60.

Figure 7A:
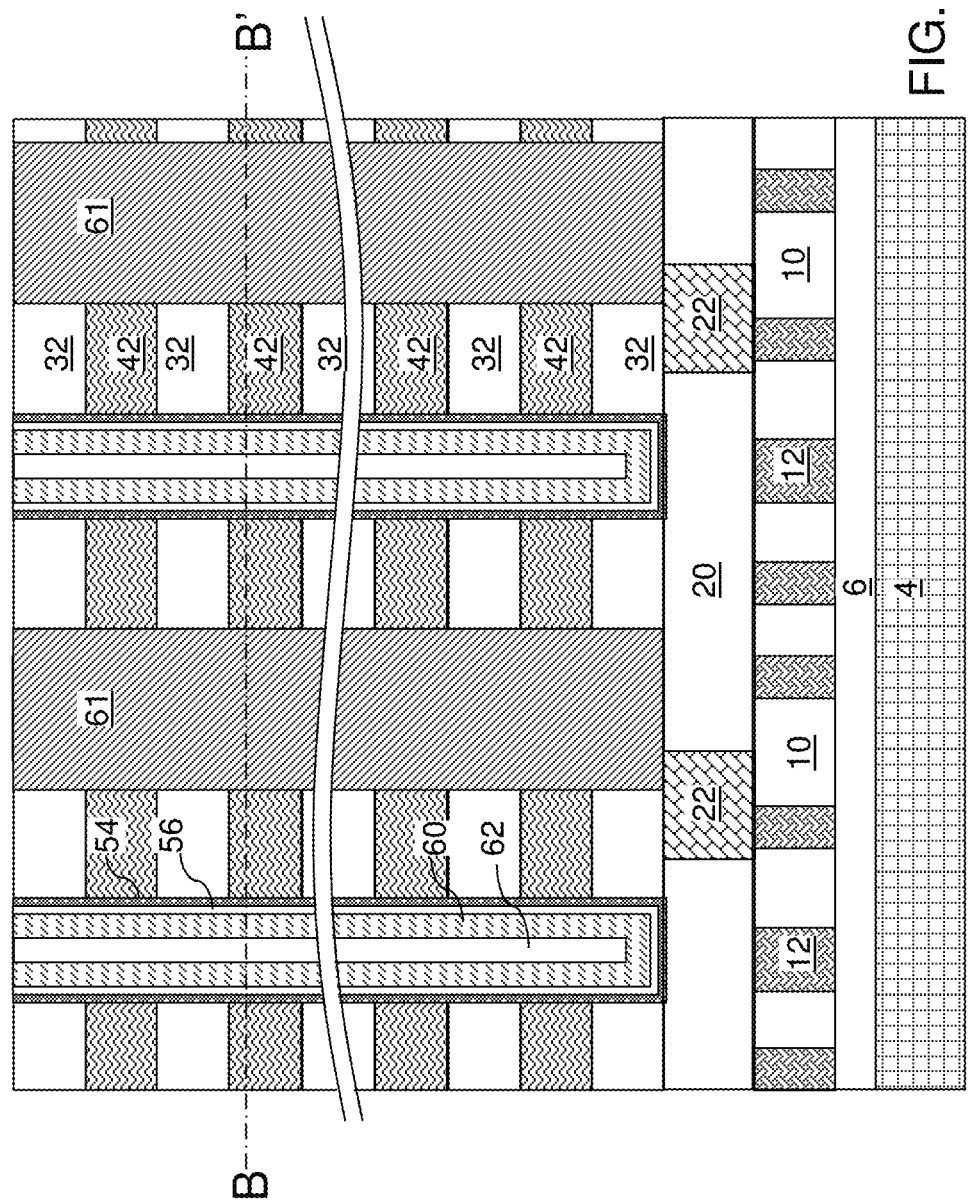
FIG. 7A is a vertical cross-sectional view of the exemplary structure after formation of active region pillars according to an embodiment of the present disclosure.
Figure 7B:
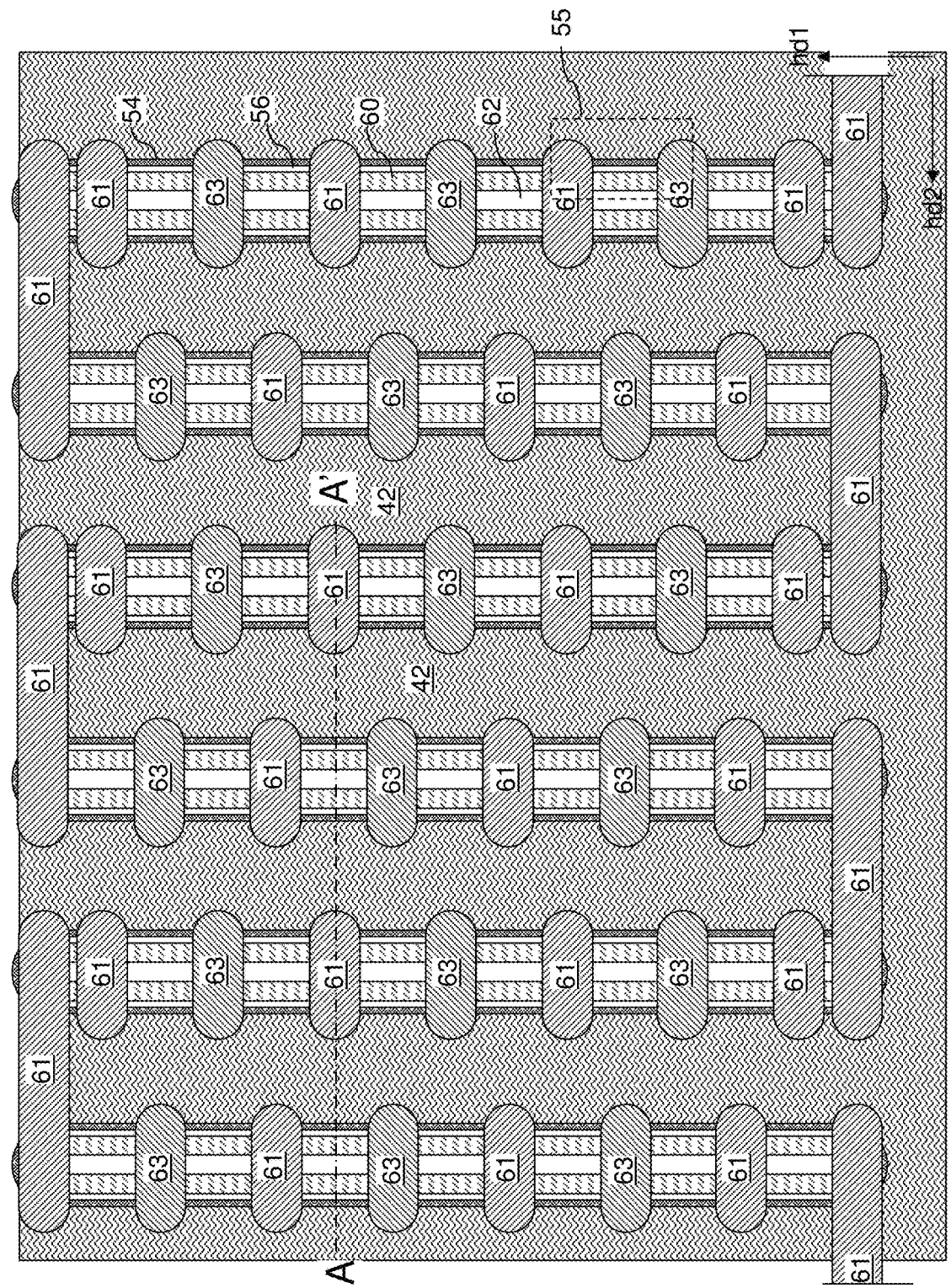
FIG. 7B is a top-down view of the exemplary structure of FIG. 7A. The vertical plane A-A' is the plane of the vertical cross-sectional view of FIG. 7A.

Referring to FIGS. 7A and 7B, a doped semiconductor material is deposited in each of the active region openings (491, 492). Excess portions of the doped semiconductor material can be deposited from above the horizontal plane including the top surface of the topmost first and second insulating layers 32 by a planarization process. The planarization process can employ a recess etch and/or a chemical mechanical planarization (CMP) process. Each remaining portion of the doped semiconductor material in active region openings (491, 492) that contact a respective one of the bottom via structures 22 constitutes a first-type active region pillar 61. Each remaining portion of the doped semiconductor material in active region openings (491, 492) that does not contact any of the bottom via structures 22 constitutes a second-type active region pillar 63.

The doped semiconductor material of the first-type active region pillars 61 and the second-type active region pillars 63 has a doping of the opposite conductivity type relative to the conductivity type of the semiconductor channel material portions 60. The conductivity type of the active region pillars (61, 63) is herein referred to as a first conductivity type, and the conductivity type of the semiconductor channel material portions 60 is herein referred to as a second conductivity type. In one embodiment, the first conductivity type is n-type and the second conductivity type is p-type. In another embodiment, the first conductivity type is p-type and the second conductivity type is n-type. The atomic concentration of the dopants of the first conductivity type in the active region pillars (61, 63) can be in a range from $1.0 \times 10^{19}/cm^3$ to $2.0 \times 10^{21}/cm^3$, such as from $1.0 \times 10^{20}/cm^3$ to $1.0 \times 10^{21}/cm^3$, although lesser and greater atomic concentrations can also be employed. The first-type active region pillars 61 and the second-type active region pillars 63 have the same material composition. Each of the first-type active region pillars 61 and the second-type active region pillars 63 can have a pair of planar sidewalls that are parallel to the second horizontal direction hd2 and a pair of convex sidewalls that connect the pair of planar sidewalls, as shown in FIG. 6B. In one embodiment, top surfaces of the first-type active region pillars 61 and the second-type active region pillars 63 can be coplanar with the top surfaces of the topmost insulating layers 32 of the vertically alternating stacks of insulating layers 32 and sacrificial material layers 42.

A plurality of laterally alternating sequences of active region pillars (61, 63) and memory stack structures (54, 56, 60) are formed upon formation of the active region pillars (61, 63). Each memory stack structure comprises a remaining portion of the line trench fill structures (54L, 56L, 60L, 62L). Each of the active region pillars (61, 63) vertically extends from a bottommost one of the sacrificial material layers 42 to a topmost one of the sacrificial material layers 42. Interfaces between the active region pillars (61, 63) and the memory stack structures (54, 56, 60) can be vertical. Interfaces between the dielectric pillar structures 62 and the active region pillars (61, 63) can be vertical.

The active region pillars (61, 63) within each laterally alternating sequence of active region pillars (61, 63) and memory stack structures (54, 56, 60) comprise an alternating sequence of source pillars and drain pillars. In one embodiment, the first-type active region pillars 61 can be source pillars that function as source regions, and the second-type active region pillars 63 can be drain pillars that function as drain regions. In another embodiment, the first-type active region pillars 61 can be drain pillars that function as drain regions, and the second-type active region pillars 63 can be source pillars that function as source regions. Each source pillar can be a common source region for plural vertical stacks of field effect transistors, such as for two vertical stacks of field effect transistors. Likewise, each drain pillar can be a common drain region for plural vertical stacks of field effect transistors, such as for two vertical stacks of field effect transistors. All field effect transistors 55 within a same vertical stack are connected in a parallel configuration to provide a vertically-extending NOR string.

Each memory stack structure (54, 56, 60) includes a first sidewall that contacts a respective one of the source pillars and a second sidewall that contacts a respective one of the drain pillars. The source pillars and the drain pillars have a doping of the first conductivity type at a same dopant concentration, and the semiconductor channel material portions 60 have a doping of the second conductivity type that is the opposite of the first conductivity type at an atomic concentration that is lower than the atomic concentration of dopants in the source pillars and the drain pillars, i.e., the first-type active region pillars 61 and the second-type active region pillars 63.

Figure 8A:
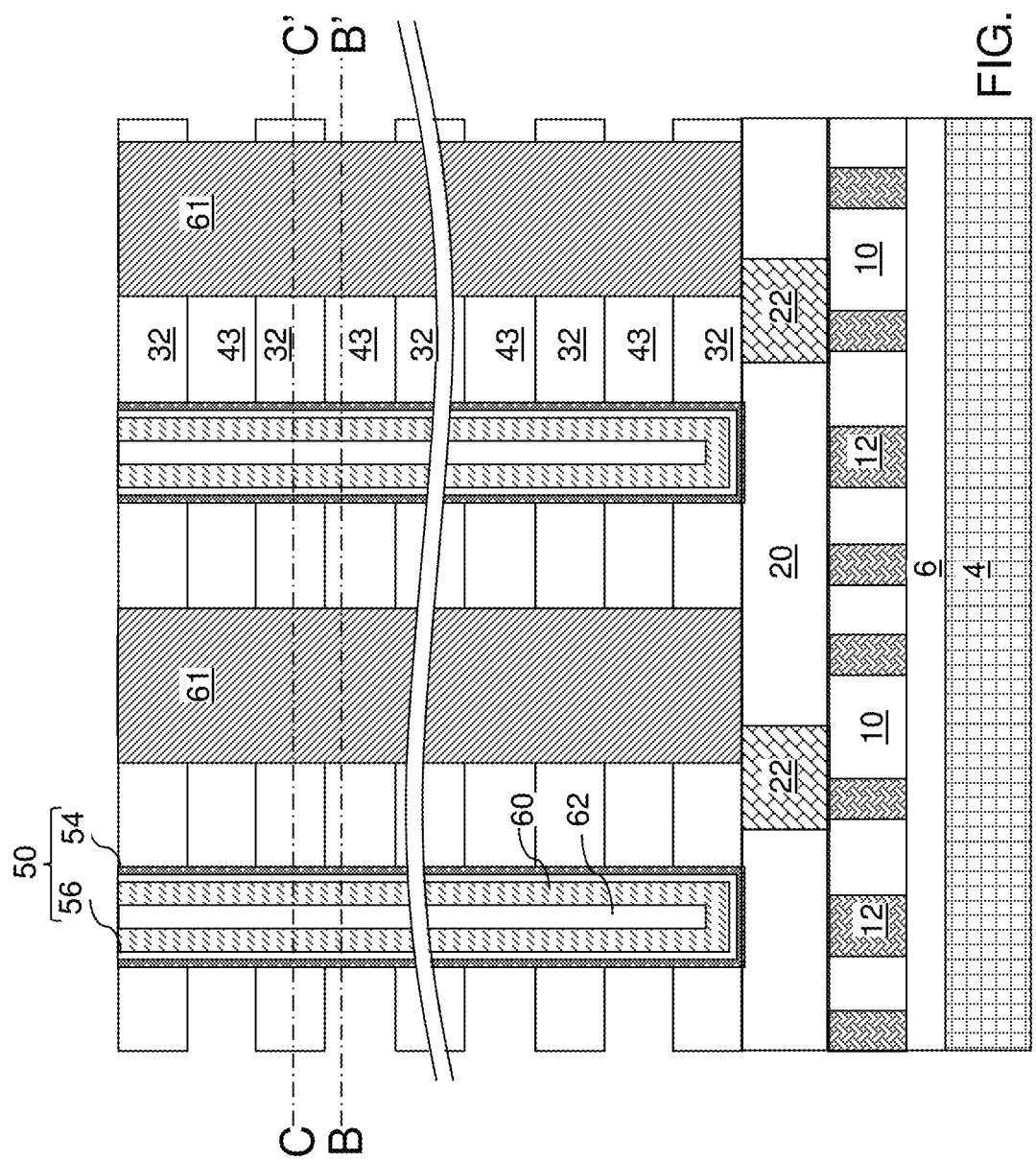
FIG. 8A is a vertical cross-sectional view of the exemplary structure after formation of backside recesses by removal of sacrificial material layers selective to the insulating layers according to an embodiment of the present disclosure.
Figure 8B:
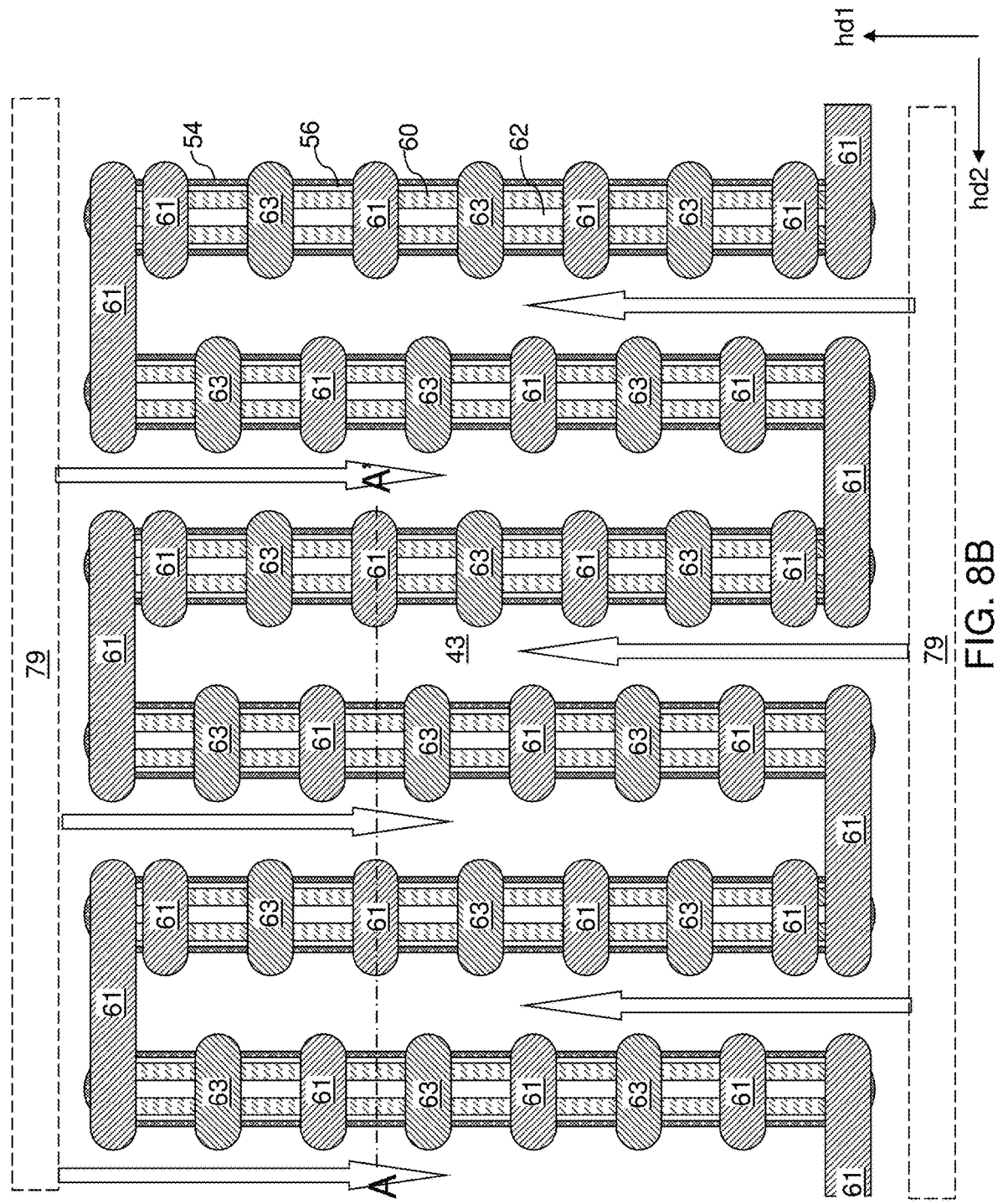
FIG. 8B is a horizontal cross-sectional view of the exemplary structure along the horizontal plane B-B' of FIG. 8A. The vertical plane A-A' is the plane of the vertical cross-sectional view of FIG. 8A.
Figure 8C:
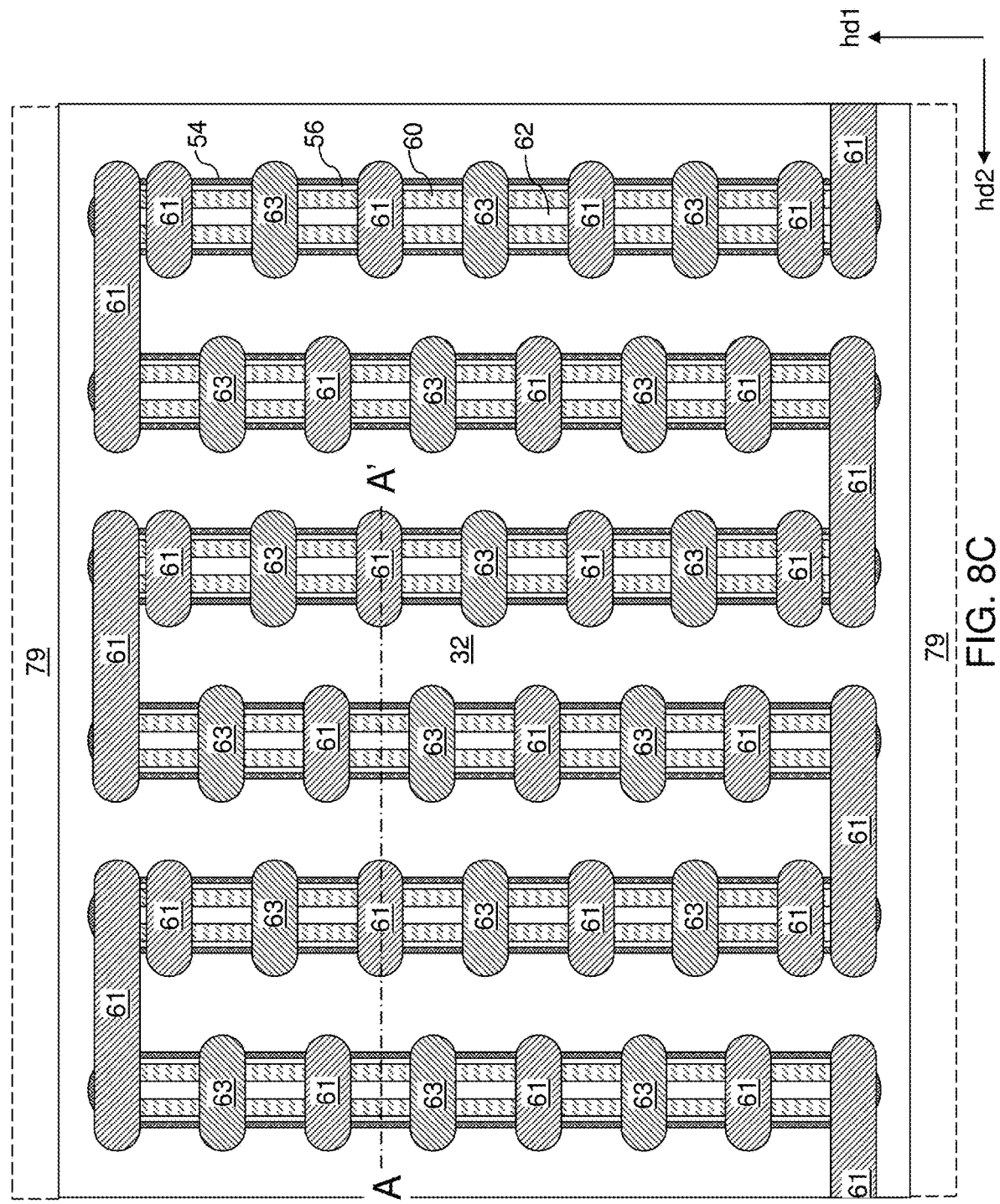
FIG. 8C is a horizontal cross-sectional view of the exemplary structure along the horizontal plane C-C' of FIG. 8A. The vertical plane A-A' is the plane of the vertical cross-sectional view of FIG. 8A.

Referring to FIGS. 8A-8C, backside trenches 79 are formed through the base portions of the vertically alternating stacks of insulating layers 32 and sacrificial material layers 42. For example, a photoresist layer (not shown) can be applied and patterned over the vertically alternating stacks (32, 42) to form line openings that extend along the second horizontal direction hd2 over the base portions of the vertically alternating stacks (32, 42). An anisotropic etch is performed to form backside trenches 79 by transferring the pattern of the line openings through the vertically alternating stacks (32, 42). A sidewall of each sacrificial material layer 42 is physically exposed to one of the backside trenches 79 after formation of the backside trenches 79. The photoresist layer can be subsequently removed by ashing.

An etchant that selectively etches the material of the sacrificial material layers 42 with respect to the materials of the insulating layers 32, the memory stack structures (54, 56, 60), and the active region pillars (61, 63) can be introduced into the backside trenches 79, for example, employing an etch process. The etch directions are indicated by arrows in FIG. 8B. Backside recesses 43 are formed in volumes from which the first and second sacrificial material layers 42 are removed. In one embodiment, the sacrificial material layers 42 can include silicon nitride, and the materials of the insulating layers 32 and the retro-stepped dielectric material portion (not shown) can include silicon oxide.

The etch process that removes the second material selective to the first material and the outermost layer of the memory films 50 which comprise at least a charge storage layer 54 and tunneling dielectric 56, and optionally a front side blocking dielectric (not shown) can be a wet etch process employing a wet etch solution, or can be a gas phase (dry) etch process in which the etchant is introduced in a vapor phase into the backside trenches 79. For example, if the sacrificial material layers 42 consist essentially of a silicon-germanium alloy or germanium and if the insulating layers 32 comprise a silicon oxide material, a wet etch process employing a mixture of ammonium hydroxide and hydrogen peroxide can be performed to remove the sacrificial material layers 42 selective to the insulating layers 32. If the sacrificial material layers 42 consist essentially of undoped amorphous silicon and if the insulating layers 32 comprise a silicon oxide material, a wet etch process employing a trimethyl-2 hydroxyethyl ammonium hydroxide solution can be performed to remove the sacrificial material layers 42 selective to the insulating layers 32. If the sacrificial material layers 42 consist essentially of porous or non-porous organosilicate glass or borosilicate glass, a wet etch process employing a dilute hydrofluoric acid can be performed to remove the sacrificial material layers 42 selective to the insulating layers 32. If the sacrificial material layers 42 consist essentially of silicon nitride and a silicon oxide or metal oxide blocking dielectric is part of the memory film 50, a wet etch process employing hot phosphoric acid can be performed to remove the sacrificial material layers 42 selective to the insulating layers 32.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which sacrificial material layers 42 are removed. The line trenches in which the memory stack structures (54, 56, 60) are formed are herein referred to as front side openings or front side cavities in contrast with the backside recesses 43. Each backside recess 43 can define a space for receiving a respective word line of the array of monolithic three-dimensional NOR devices (e.g., NOR strings).

Each of the plurality of backside recesses 43 can extend substantially parallel to the top surface of the substrate 4. A backside recess 43 can be vertically bounded by a top surface of an underlying insulating layer 32 and a bottom surface of an overlying insulating layer 32. In one embodiment, each backside recess 43 can have a uniform height throughout. Sidewalls of the charge storage layers 54 (or the optional front side blocking dielectrics) are physically exposed around each backside recess 43.

Figure 9A:
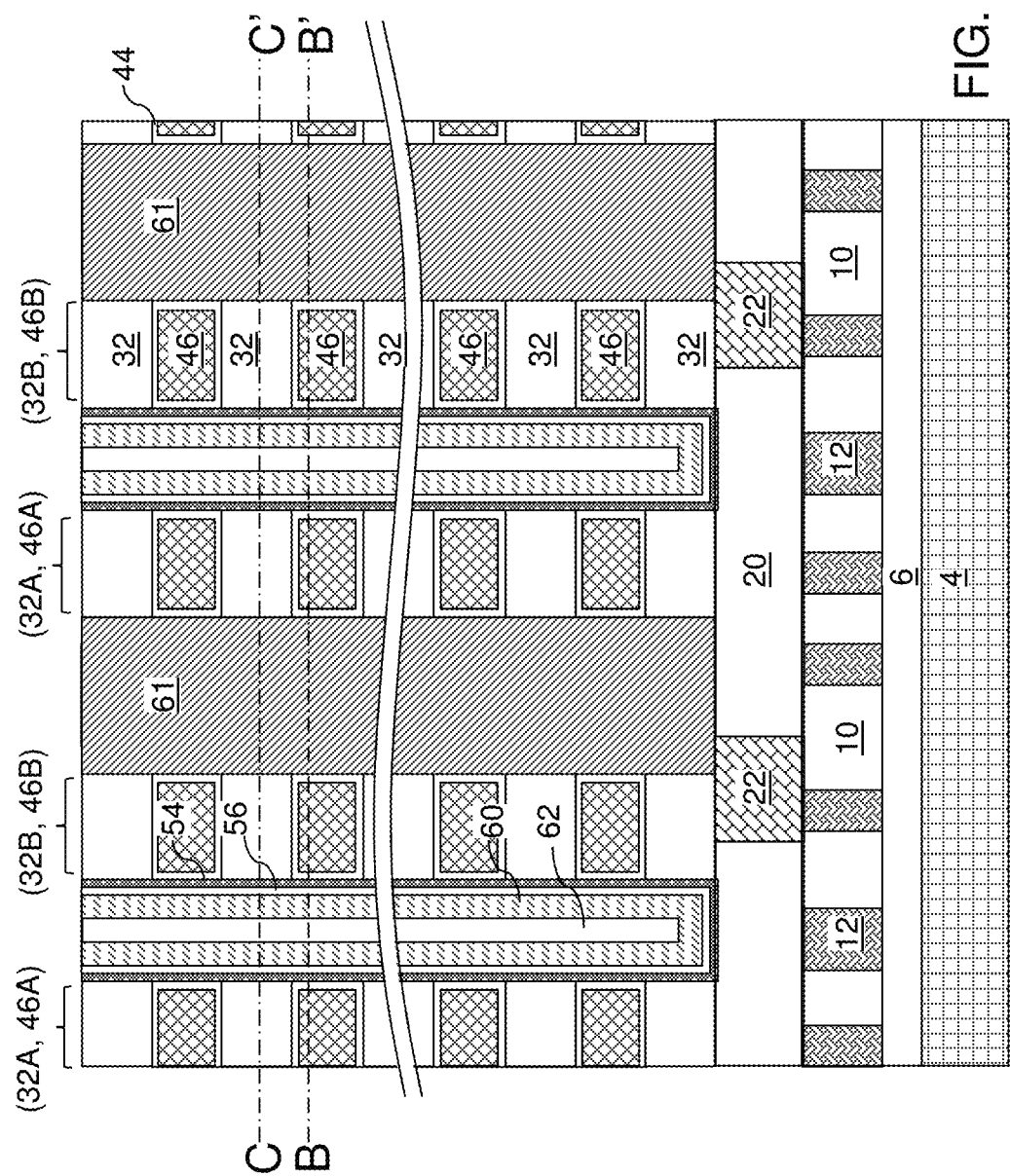
FIG. 9A is a vertical cross-sectional view of the exemplary structure after formation of backside blocking dielectric layers and electrically conductive layers according to an embodiment of the present disclosure.
Figure 9B:
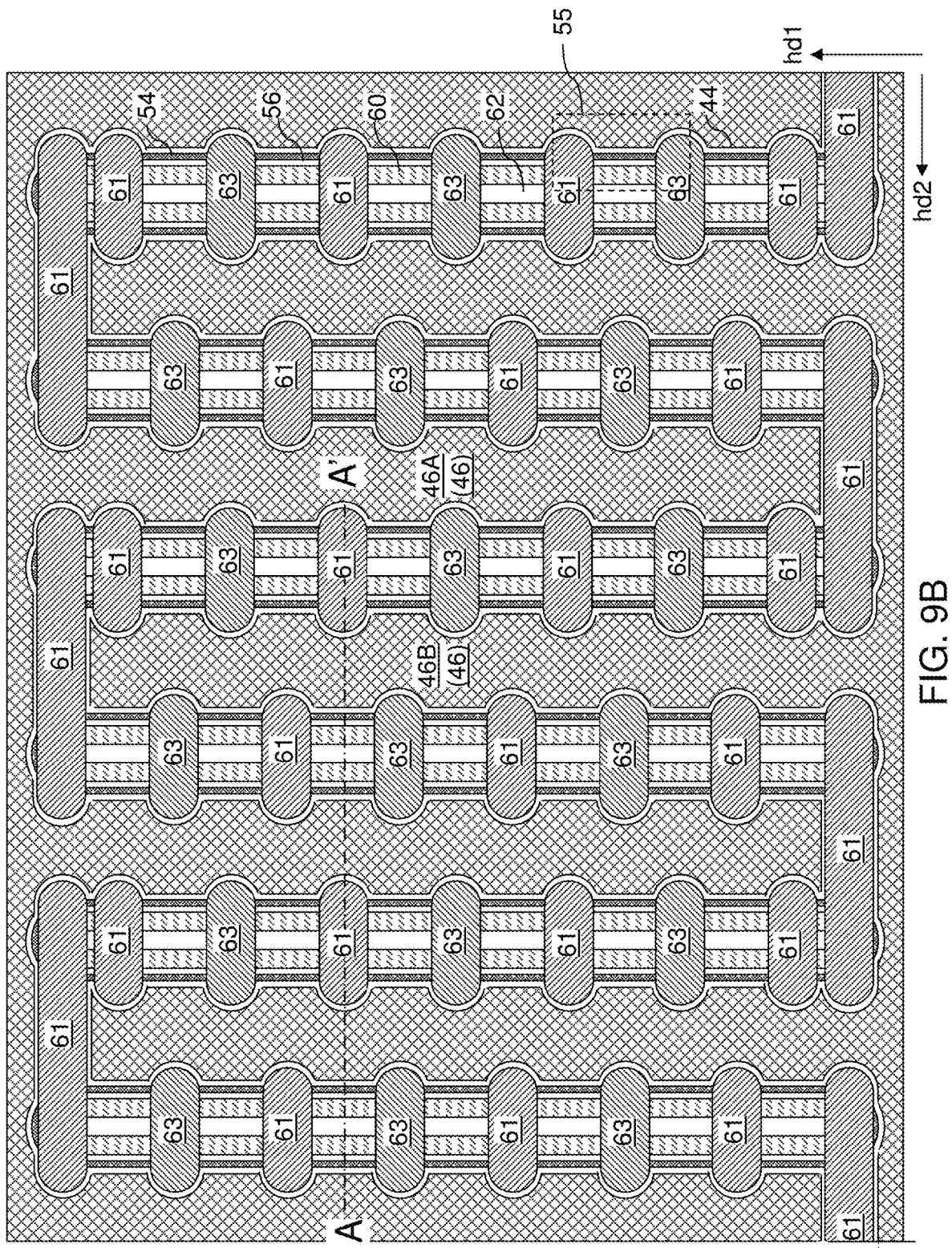
FIG. 9B is a horizontal cross-sectional view of the exemplary structure along the horizontal plane B-B' of FIG. 9A. The vertical plane A-A' is the plane of the vertical cross-sectional view of FIG. 9A.
Figure 9C:
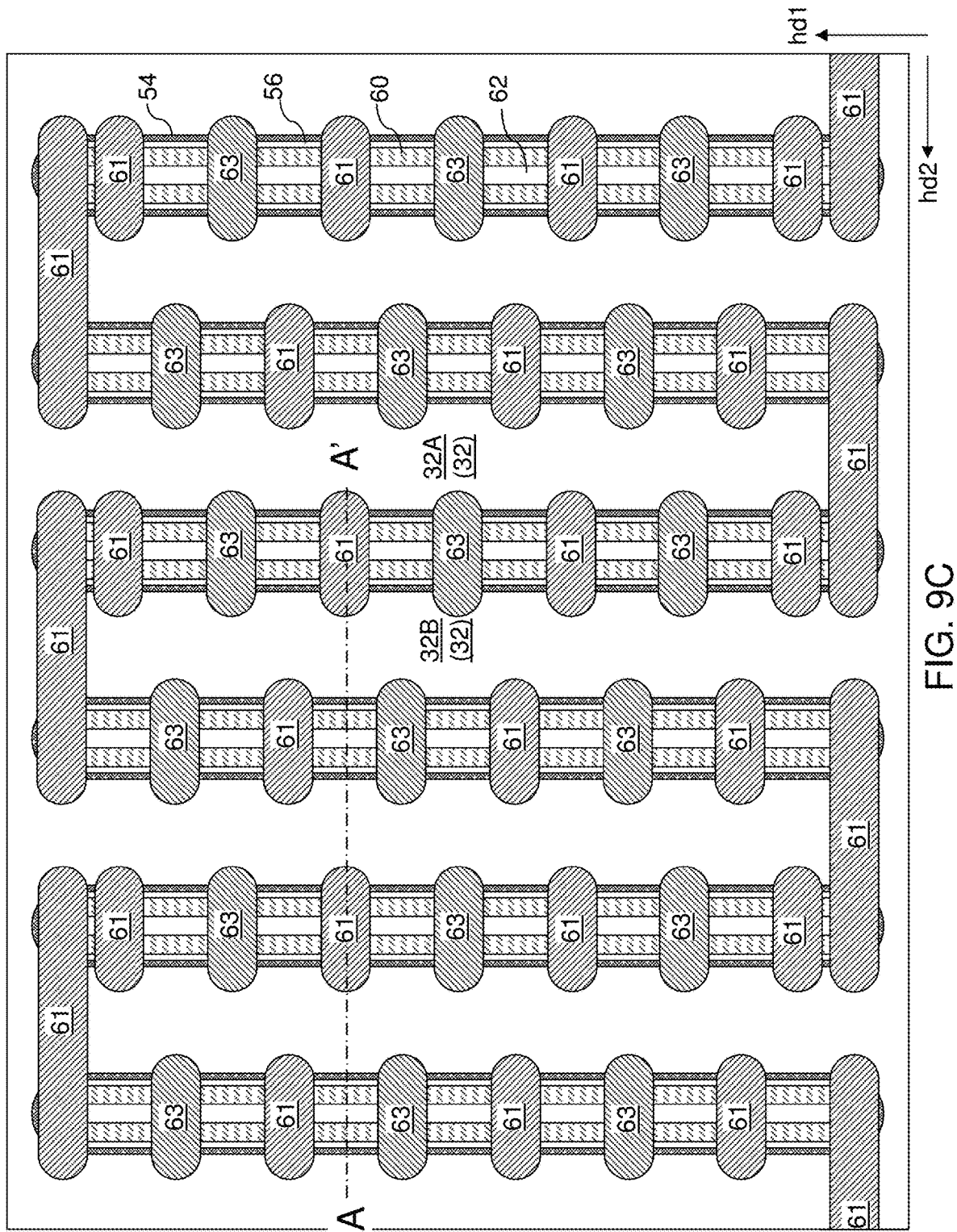
FIG. 9C is a horizontal cross-sectional view of the exemplary structure along the horizontal plane C-C' of FIG. 9A. The vertical plane A-A' is the plane of the vertical cross-sectional view of FIG. 9A.

Referring to FIGS. 9A-9C, a backside blocking dielectric layer 44 can be formed in the backside recesses 43 directly on the physically exposed surfaces of the charge storage layers 54. The backside blocking dielectric layer 44 comprises a dielectric material that functions as a control gate dielectric for the control gates to be subsequently formed in the backside recesses 43. In one embodiment, the backside blocking dielectric layer 44 can include a layer stack of a conformal silicon oxide layer and a conformal dielectric oxide layer (such as an aluminum oxide layer). Alternatively, the backside blocking dielectric layer 44 can comprise aluminum oxide and the optional front side blocking dielectric can comprise silicon oxide. The backside blocking dielectric layer 44 can be formed on sidewalls of the backside trenches 79 and on horizontal surfaces of the insulating layers 32. In one embodiment, the backside blocking dielectric layer 44 can be formed by a conformal deposition process such as atomic layer deposition (ALD). The thickness of the backside blocking dielectric layer 44 can be in a range from 2 nm to 15 nm, such as 4 to 10 nm, although lesser and greater thicknesses can also be employed.

Subsequently, at least one metallic material can be deposited in remaining volumes of the backside recesses 43 and peripheral regions of the backside trenches 79. In one embodiment, a metallic barrier layer and a metal fill material layer can be deposited to fill the backside recesses 43. The metallic barrier layer includes an electrically conductive metallic material that can function as a diffusion barrier layer and/or adhesion promotion layer for a metallic fill material to be subsequently deposited. For example, the metallic barrier layer can include a conductive metallic nitride material such as TiN, TaN, WN, or a stack thereof, or can include a conductive metallic carbide material such as TiC, TaC, WC, or a stack thereof. The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN. The metal fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal such as tungsten. In one embodiment, the metallic fill material layer can be deposited employing a fluorine-containing precursor gas such as $WF_6$.

A plurality of electrically conductive layers 46 can be formed in the plurality of backside recesses 43, and a continuous metallic material layer can be formed on the sidewalls of each backside trenches 79 and over the topmost insulating layers 32. Each electrically conductive layer 46 can include a portion of the metallic barrier layer and a portion of the metallic fill material layer that are located between a vertically neighboring pair of insulating layers 32.

The continuous metallic material layer within the backside trenches 79 and over the topmost insulating layers 32 can be removed by an isotropic etch back process. The electrically conductive layers 46 are formed in remaining volumes of the backside recesses 43 and on the backside blocking dielectric layer 44. Thus, each sacrificial material layer 42 can be replaced with an electrically conductive layer 46. The backside trenches 79 can be filled with a dielectric material to form dielectric wall structures therein.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures (54, 56, 60). In other words, each electrically conductive layer 46 can be a word line that functions as a common control gate electrode for the plurality of vertical memory devices.

The electrically conductive layers 46 comprise first electrically conductive layers 46A formed between vertically neighboring pairs of the first insulating layers 32A, and second electrically conductive layers 46B formed between neighboring pairs of the second insulating layers 32B. The first insulating layers 32A and the first electrically conductive layers 46A constitute a first vertically alternating stack (32A, 46A), and the second insulating layers 32B and the second electrically conductive layers 46B constitute a second vertically alternating stack (32B, 46B). In one embodiment, the first vertically alternating stack (32A, 46A) and the second vertically alternating stack (32B, 46B) have an interdigitated configuration in which fingers of the first vertically alternating stack (32A, 46A) and fingers of the second vertically alternating stack (32B, 46B) alternately extend along the first horizontal direction hd1 between each neighboring pair among the plurality of laterally alternating sequences of active region pillars (61, 63) and memory stack structures (54, 56, 60). As shown in FIGS. 9A and 9B, each memory cell of the NOR type memory cell can comprise the field effect transistor 55 containing a charge storage region (e.g., portion of the charge storage layer 54). Each field effect transistor 55 can comprise a portion of one of the electrically conductive layers (46A or 46B) which functions as a control gate electrode, and respective portions of the memory film 50, semiconductor channel 60 and active region pillars (61, 63) located at the level of the respective control gate electrode (46A or 46B).

Figure 10A:
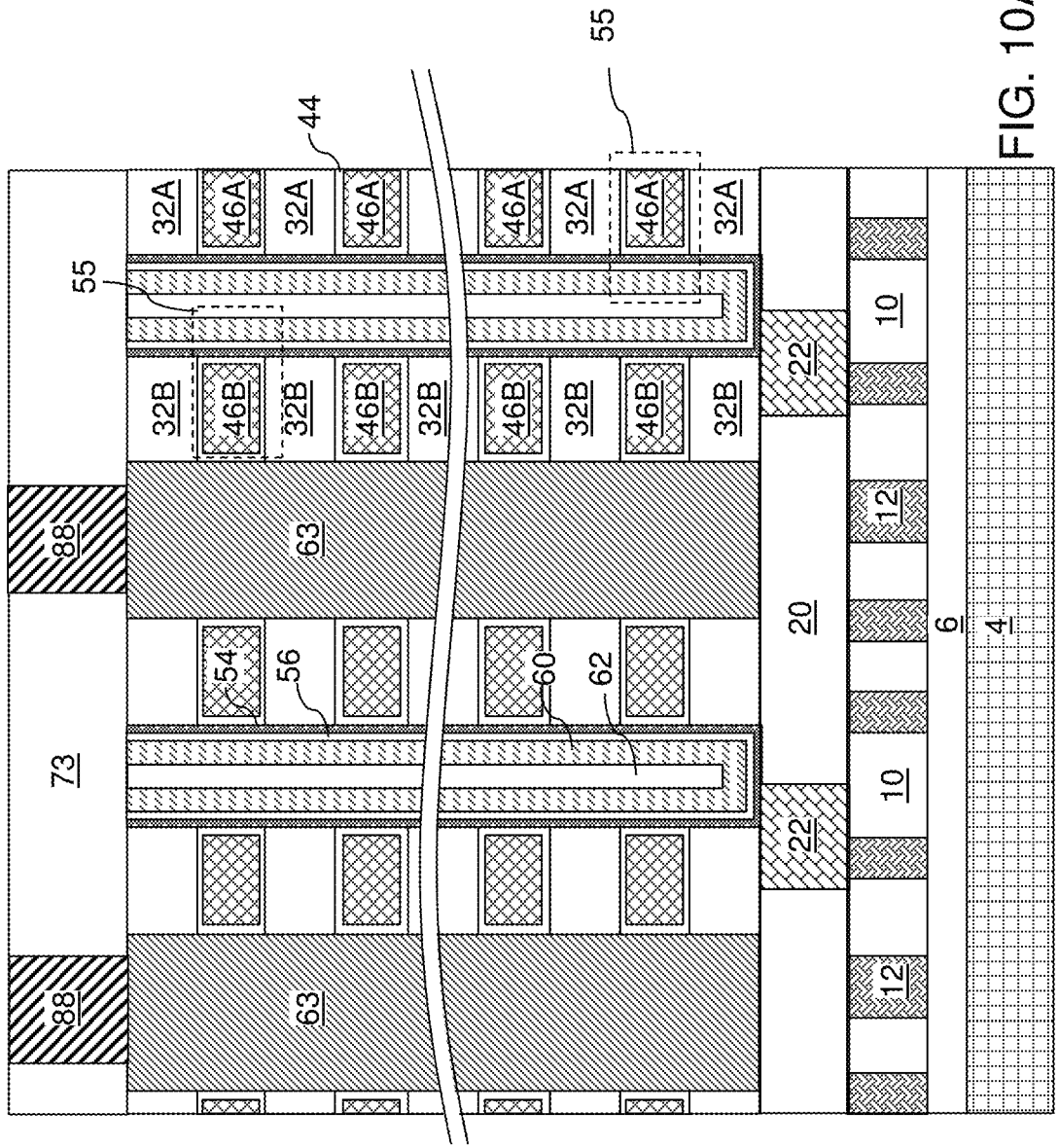
FIG. 10A is a schematic vertical cross-sectional view of the exemplary structure after formation of top via level dielectric layer and top via structures according to an embodiment of the present disclosure.
Figure 10B:
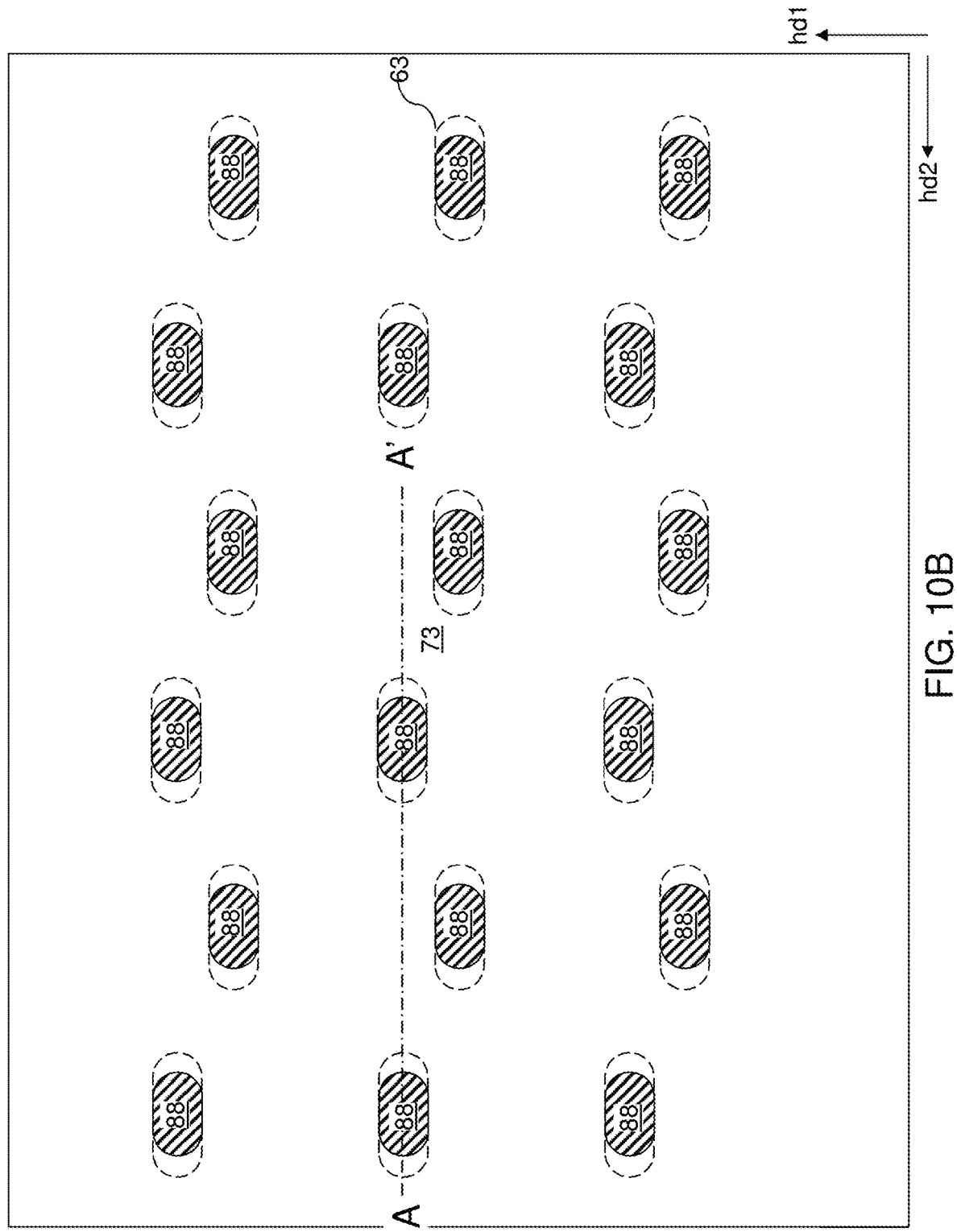
FIG. 10B is a top-down view of the exemplary structure of FIG. 10A. The vertical plane A-A' is the plane of the vertical cross-sectional view of FIG. 10A.

Referring to FIGS. 10A and 10B, top via structures 88 embedded within a top via level insulating layer 73 can be subsequently formed. The top via level insulating layer 73 includes a dielectric material such as silicon oxide. The top via level insulating layer 73 can be formed over the vertically alternating stacks (32, 46) by deposition of a dielectric material. For example, a doped silicate glass material or an undoped silicate glass material may be deposited on the top surfaces of the vertically alternating stacks (32, 46) by plasma enhanced chemical vapor deposition. The thickness of the top via level insulating layer 73 can be in a range from 50 nm to 300 nm, although lesser and greater thicknesses can also be employed.

Via cavities are formed though the top via level insulating layer 73 by application and patterning of a photoresist layer over the top via level insulating layer 73, and transferring the pattern in the photoresist layer through the top via level insulating layer 73 employing an anisotropic etch process. The via cavities are formed in areas overlying first-type active region pillars are to be subsequently formed. The first-type active regions may be source regions or drain regions. The photoresist layer is subsequently removed, for example, by ashing. At least one conductive material is deposited in the via cavities, and excess portions of the at least one conductive material is removed from above a horizontal plane including the top surface of the top via level insulating layer 73. Each remaining portion of the at least one conductive material constitutes a top via structure 88. The shapes of the top via structures 88 can be selected to provide electrical contact between a respective underlying second-type active region pillars 63 and a respective top active line to be subsequently formed above the top via level insulating layer 73.

Figure 11A:
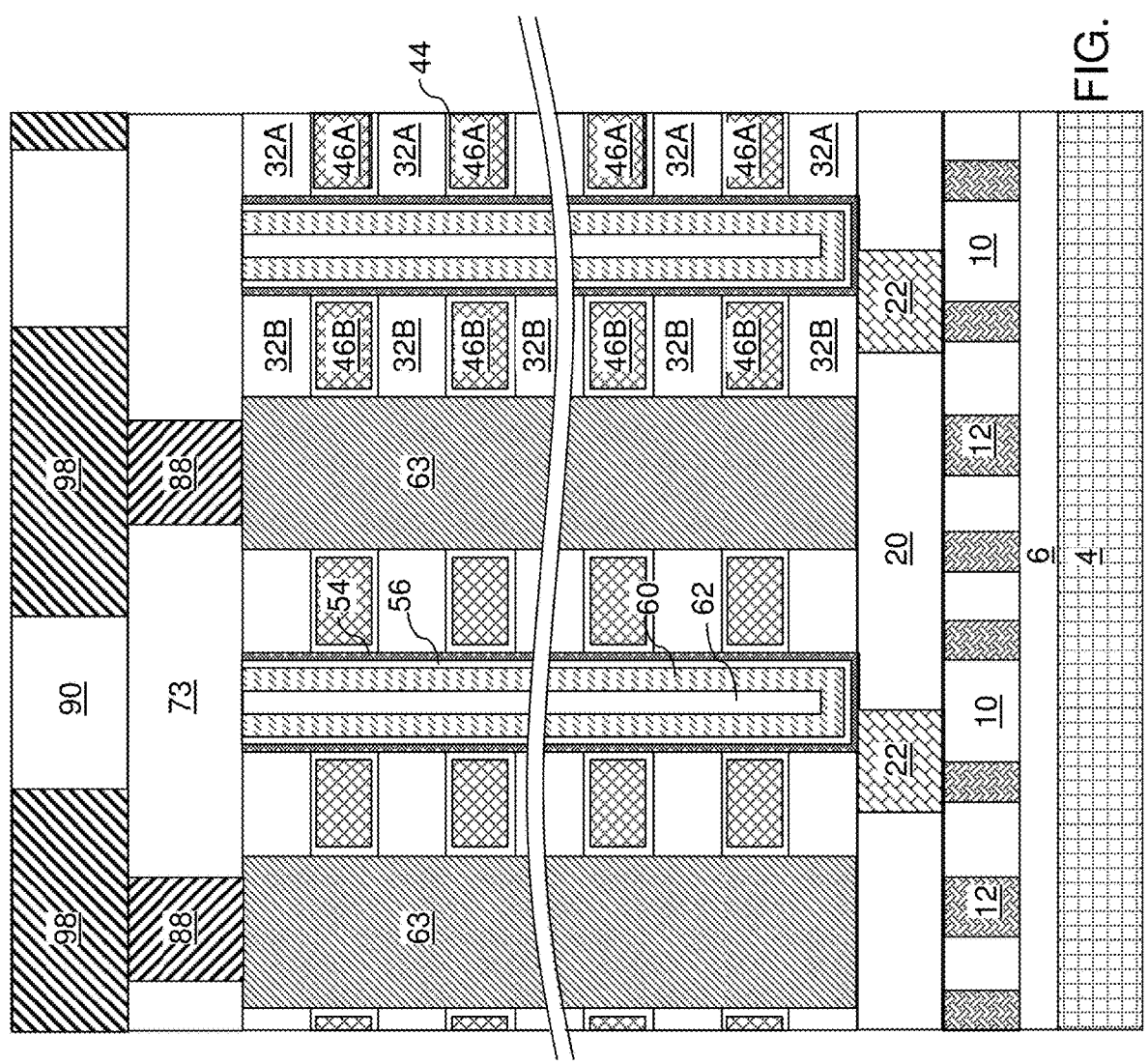
FIG. 11A is a schematic vertical cross-sectional view of an exemplary structure after formation of a top line level dielectric layer and top active lines according to an embodiment of the present disclosure.
Figure 11B:
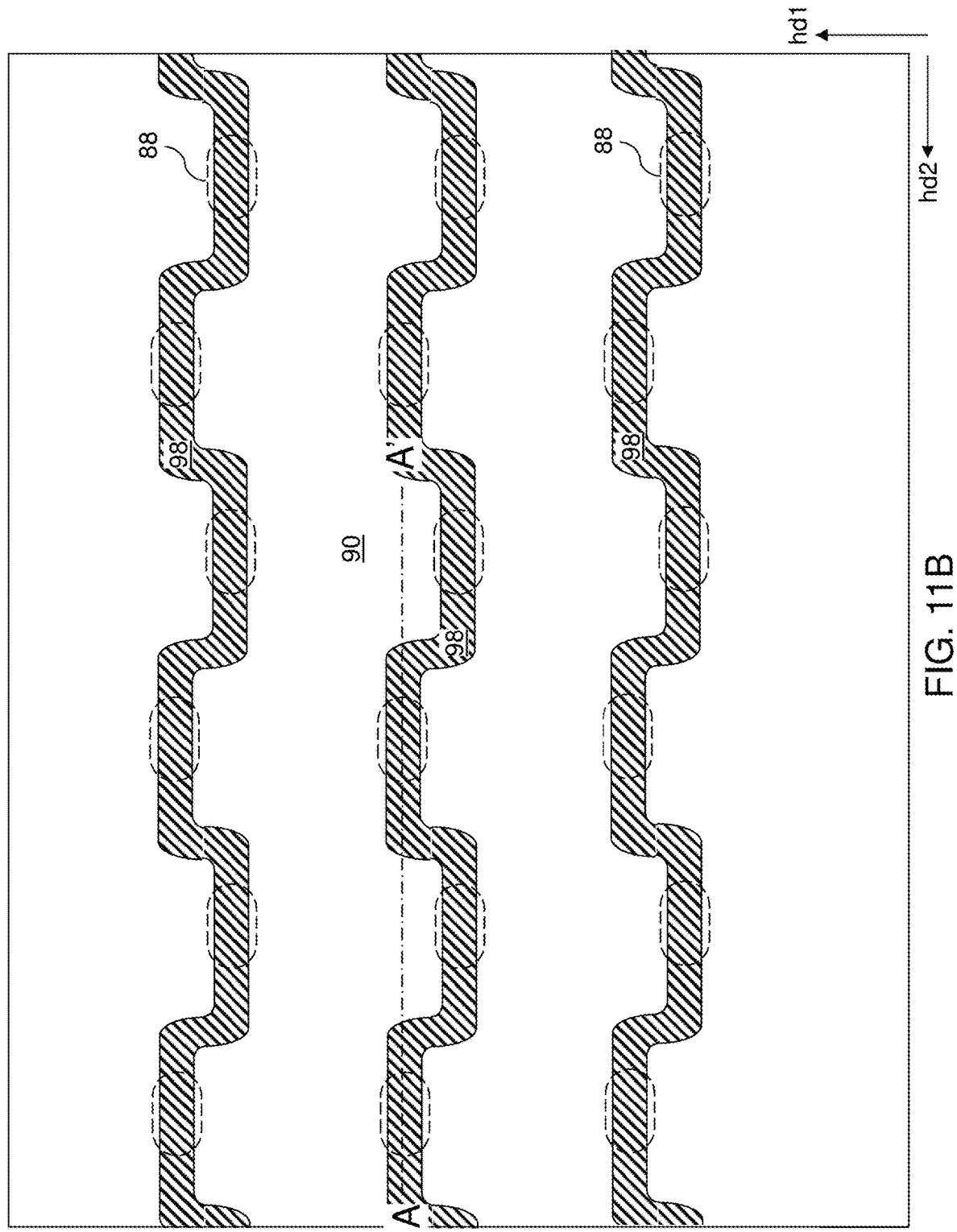
FIG. 11B is a top-down view of the exemplary structure of FIG. 11A. The vertical plane A-A' is the plane of the vertical cross-sectional view of FIG. 11A.

Referring to FIGS. 11A and 11B, a top line level insulating layer 90 can be deposited over the top via level insulating layer 73. The top line level insulating layer 90 includes a dielectric material such as silicon oxide. The top line level insulating layer 90 can be formed by deposition of a dielectric material. For example, a doped silicate glass material or an undoped silicate glass material may be deposited on the top surface of the top via level insulating layer 73 by plasma enhanced chemical vapor deposition. The thickness of the top line level insulating layer 90 can be in a range from 50 nm to 300 nm, although lesser and greater thicknesses can also be employed.

Line trenches that generally extend laterally along the first horizontal direction hd1 and laterally spaced apart along the second horizontal direction hd2 can be patterned through the top line level insulating layer 90 by lithographic methods. The pattern of the line trenches can be a general line and space pattern with optional modifications to provide sufficient electrical isolation distance for top via structures 88. At least one electrically conductive material can be deposited in the line trenches to form top active lines 98. The top active lines 98 can be source lines or drain lines that are electrically connected to source regions or drain regions of parallel lateral field effect transistors of vertical NOR strings. If the bottom active lines 12 are source lines, the top active lines 98 are drain lines. If the bottom active lines 12 are drain lines, the top active lines 98 are source lines. The shapes of the top active lines 98 and the shapes of the top via structures 88 can be selected to avoid electrical shorts among neighboring pairs of the top active lines 98.

Generally, source lines electrically shorted to a respective one of the source pillars, and drain lines are electrically shorted to a respective one of the drain pillars. In a first configuration, the drain lines comprise the bottom active lines 12 that underlie all electrically conductive layers 46, the first-type active region pillars 61 are drain pillars functioning as drain regions, the second-type active region pillars 63 are source pillars functioning as source regions, and the source lines comprise the top active lines 98 and overlie all electrically conducive layers 46. In a second configuration, the source lines comprise the bottom active lines 12 that underlie all electrically conductive layers 46, the first-type active region pillars 61 are source pillars functioning as source regions, the second-type active region pillars 63 are drain pillars functioning as drain regions, and the drain lines comprise the top active lines 98 and overlie all electrically conducive layers 46.

Figure 11C:
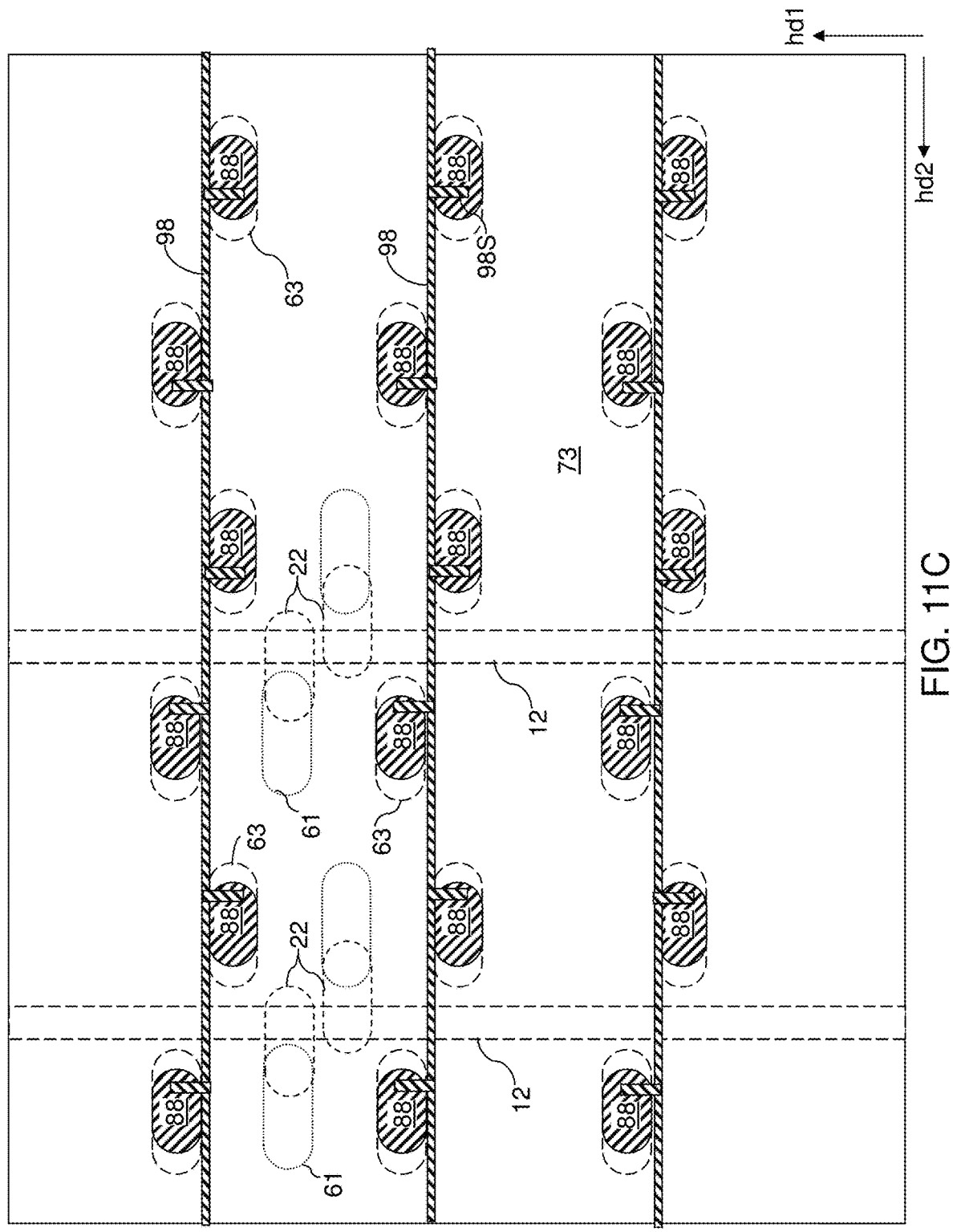
FIG. 11C is top-down, see-through view of an exemplary structure of an alternative embodiment.

FIG. 11C illustrates an alternative structure of an alternative embodiment of the present disclosure. The configuration shown in FIG. 11C contains straight top active lines 98 instead of the curved top active lines 98 which curve to contact respective top via structures 88 as shown in FIG. 11B. In the configuration shown in FIG. 11C, electrically conductive straps 98S may be used to electrically connect the straight to active lines 98 to the respective top via structures 88.

The structures illustrated in FIGS. 11B and 11C include bottom active lines 12 and top active lines 98 located on opposite top and bottom sides of the alternating stack (32, 46) in a cross bar configuration in which the bottom and top active lines extend in non-parallel directions, such as perpendicular directions. In another alternative embodiment, both sets of active lines (12, 98) can be located on the same side of the alternating stack (32, 46). For example, both sets of active lines (12, 98) can be located either above or below the alternating stack (32, 46).

The cross bar configuration permits each field effect transistor (i.e., each memory cell) 55 to be accessed individually for programming or reading (i.e., sensing) operations by selecting a respective bottom active line 12 which electrically contacts the active pillar 61 (e.g., source or drain) of the selected field effect transistor 55, the top active line 98 which electrically contacts the other active pillar 63 (e.g., drain or source) of the selected field effect transistor 55 and the respective electrically conductive layer (i.e., control gate electrode) of the selected field effect transistor 55.

Figure 12:
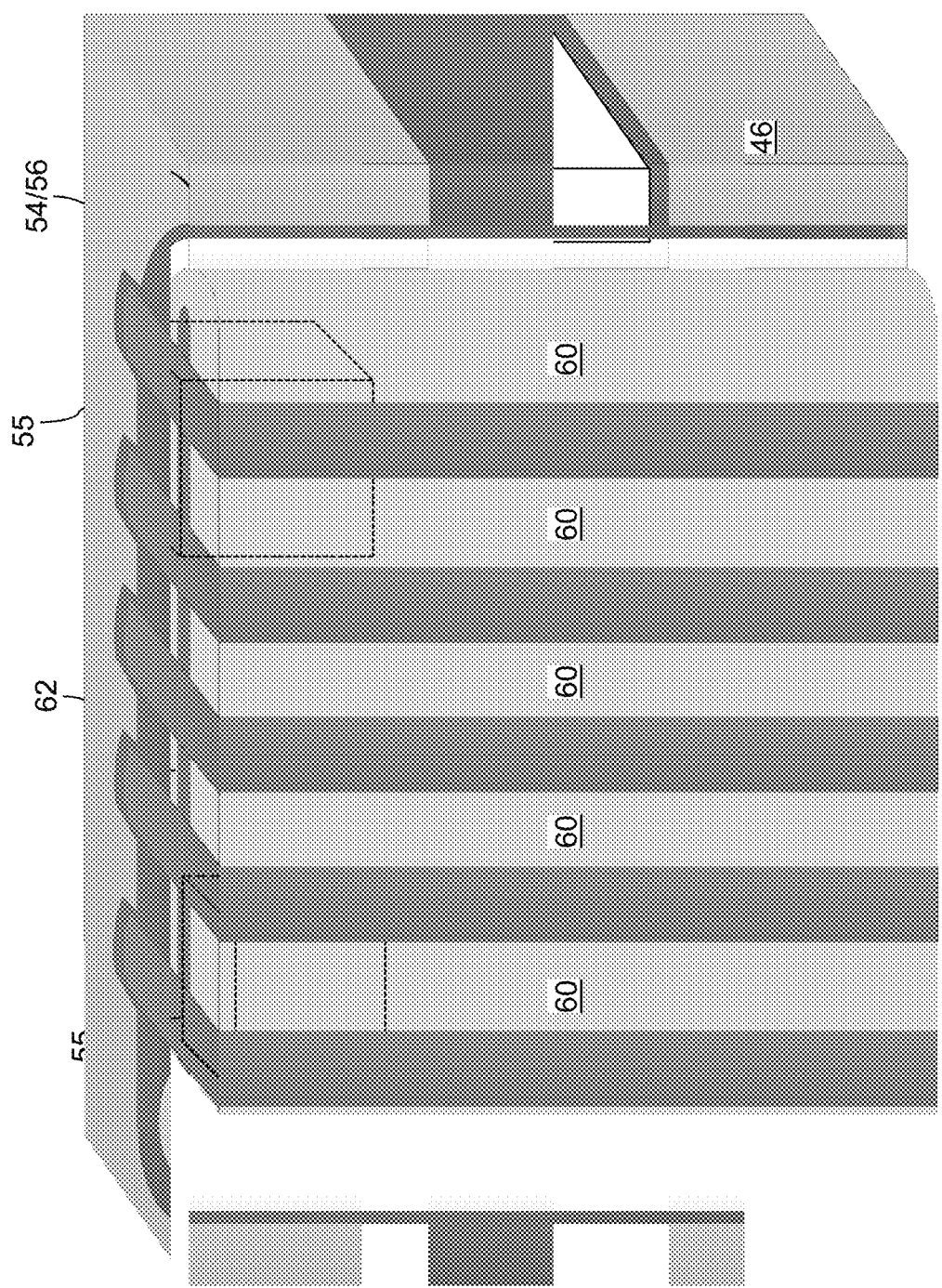
FIG. 12 is a perspective view of a cut-out portion of the exemplary structure.
Figure 13:
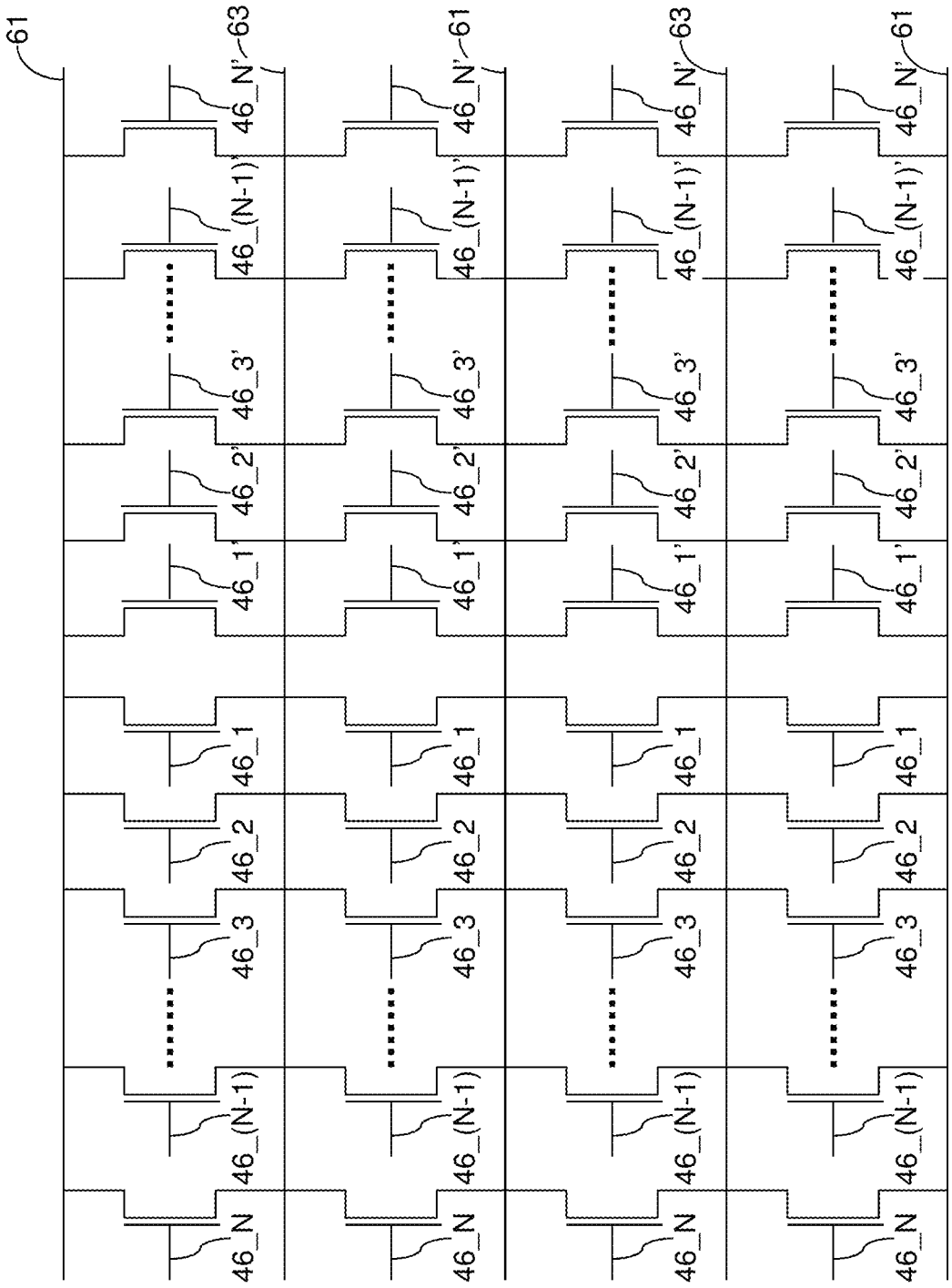
FIG. 13 is an illustration of a circuit schematic of a NOR string of the present disclosure.

FIG. 12 is a perspective view of a cut-out portion of the exemplary structure, and FIG. 13 is an illustration of a circuit schematic of a NOR type memory device of the embodiment of the present disclosure. The first vertically alternating stack (32A, 46A) includes N first electrically conductive layers 46A that are first N word lines (46_1, 46_2, 46_3, . . . , 46_(N−1), 46_N), and the second vertically alternating stack (32B, 46B) include N second electrically conductive layers 46B that are second N word lines (46_1', 46_2', 46_3', . . . , 46_(N−1)', 46_N'). Between each neighboring pair of a first-type active region pillars 61 and a second-type active region pillars 63 that are laterally spaced along the second horizontal direction, two vertical stacks of field effect transistors are connected in parallel, each being controlled by a respective one of the 2N word lines that include the N first electrically conductive layers 46A and the N second electrically conductive layers 46B. 2N channels of 2N lateral field effect transistors comprise portions of a single semiconductor channel material portion 60, and are connected in a parallel connection between each neighboring pair of a source pillar and a drain pillar that are laterally spaced apart along the first horizontal direction hd1.

Figure 14A:
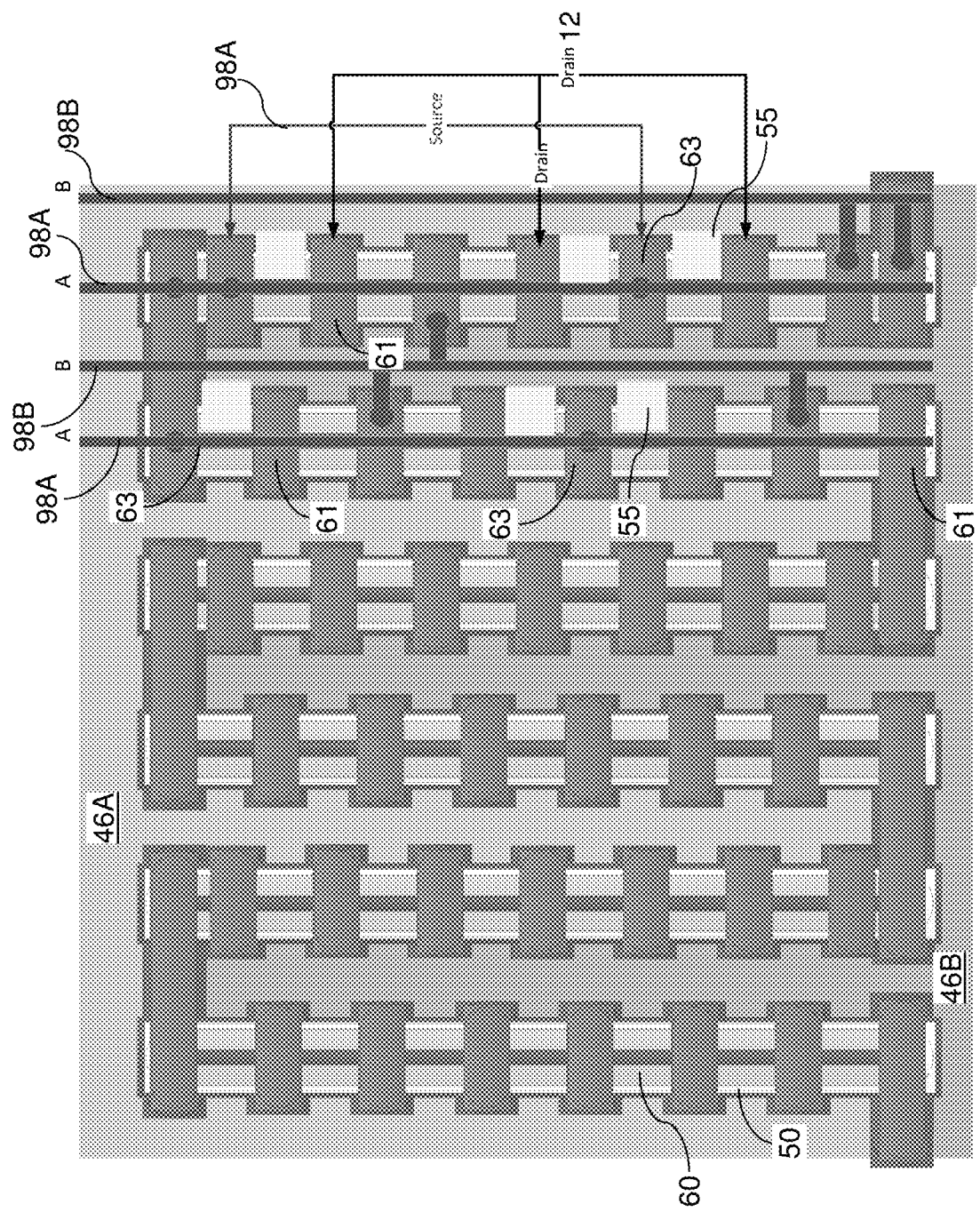
FIGS. 14A and 14B are schematic top-down, see-through views of an exemplary structure of another alternative embodiment.
Figure 14B:
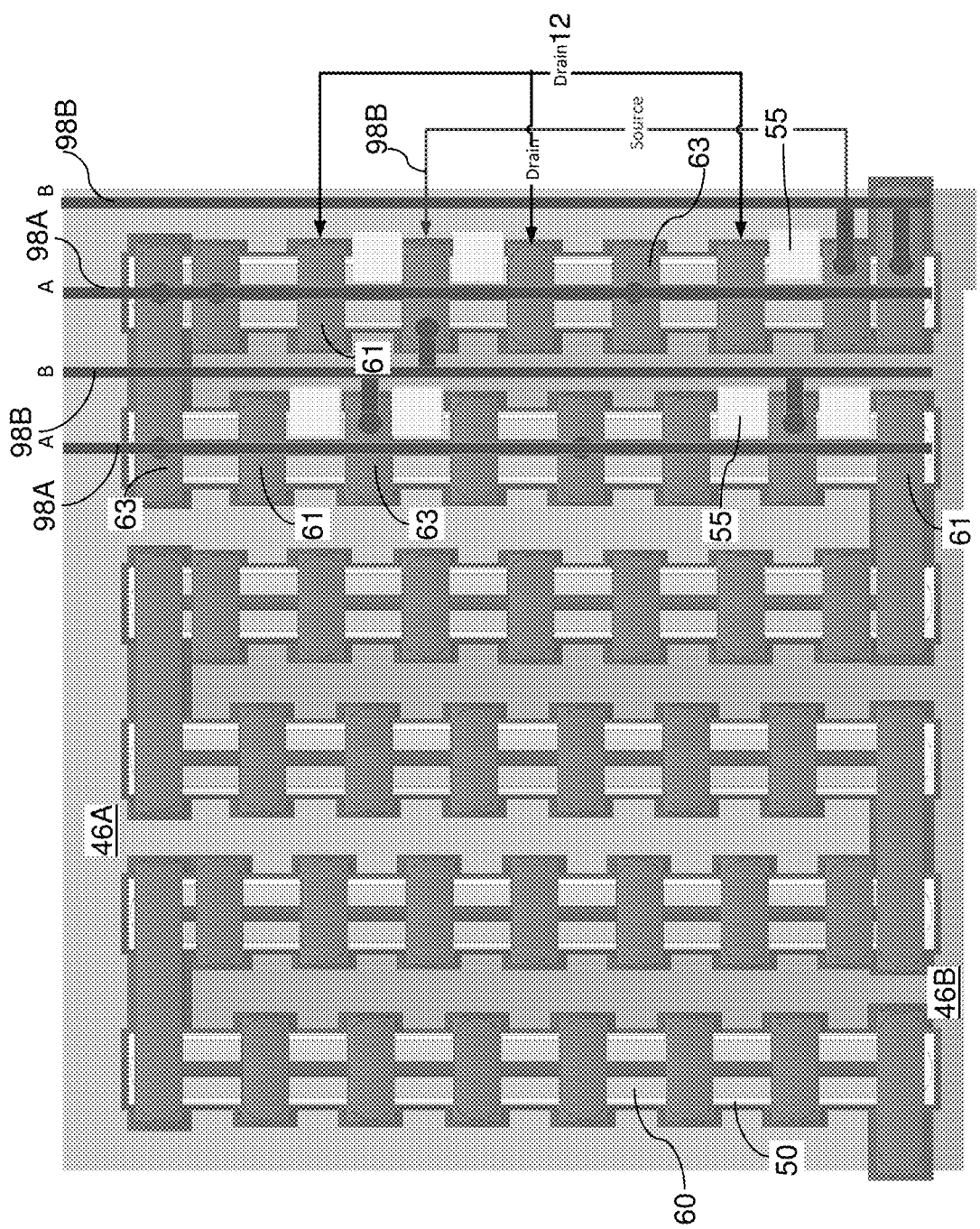

FIGS. 14A and 14B illustrate an alternative structure according to another alternative embodiment. In this alternative embodiment, the bottom active lines 12 and the top active lines 98 extend in the same direction (e.g., the first horizontal direction hd1) on opposite sides of the alternating stack (32, 46). In this embodiment, several memory cells 55 (i.e., transistors) can be programmed in parallel with the same bit of data (e.g., 0 or 1 state).

In this embodiment, the top active lines 98 may comprise two sets of alternating top active lines (98A, 98B), such as source lines. During programming operations, one set of the top active lines is active and the other set is inactive.

For example, as shown in FIG. 14A, the first set of top active lines (e.g., source lines) 98A is active (i.e., is under a program or read voltage) and the other set 98B is inactive. Several memory cells (i.e., field effect transistors) 55 located at the vertical level of an activated word line 46 and having their source regions 63 electrically connected to the first set of top active lines 98A can be accessed (e.g., programmed or read).

As shown in FIG. 14B, the second set of top active lines (e.g., source lines) 98B is active and the other set 98A is inactive. Several other memory cells (i.e., field effect transistors) 55 located at the vertical level of an activated word line 46 and having their source regions 63 electrically connected to the second set of top active lines 98B can be accessed (e.g., programmed or read).

During programming and reading (e.g., sensing) operations, a low negative voltage is applied to the non-selected word lines 46 to prevent influence on the selected horizontal field effect transistor 55 since all word lines 46 share the same source and drain regions (61, 63). The channels of the horizontal field effect transistors 55 are provided within a respective semiconductor channel material portion 60. The word lines comprise the electrically conductive layers 46. A vertical stack of N field effect transistors shares a same source pillar as a source region and a same drain pillar as a drain region. In case npn field effect transistors 55 are used (in which the source pillars and the drain pillars are n-doped and the semiconductor channel material portions 60 are p-doped), the low negative voltage bias can be applied to all non-selected word lines 46 to prevent influence on the device operation while controlling of the selected transistor 55 through a selected word line 46.

During a sensing operation, a gate voltage that turns on a selected horizontal field effect transistor 55 can be applied to a selected word line 46 of the selected transistor and a current between the source and drain regions (61, 63) of the selected transistor 55 is measured using a sensing (e.g., peripheral) circuitry. For a programming (i.e., write) operation, a high voltage can be applied only to the selected word line 46 of the selected field effect transistor 55 with a voltage differential between the source pillar and the drain pillar (i.e., source and drain regions (61, 63) of the selected transistor 55 to induce charge tunneling into the selected charge storage element (e.g., portion of the memory film 50 of the selected transistor 55), while unselected field effect transistors 55 are turned off by applying a low voltage to their respective unselected word lines. For an erase operation, a high negative voltage can be applied to the word lines to erase the electrical charges that were previously trapped in the charge storage elements of various transistors.

To select a memory cell (e.g., field effect transistor) 55 for operation, the source pillar and the drain pillar that contact the memory cell 55 are biased with a source bias voltage and a drain bias voltage, respectively. Since each current readout from a drain pillar can be effected by electrical current originating from two neighboring source pillars, one source pillar is activated and the other source pillar is inactivated during a sense operation. The voltage bias to the selected source pillar and the unselected source pillars can be provided by source active lines, which may be bottom active lines 12 or top active lines 98. The voltage bias to the selected drain pillar and the unselected drain pillars can be provided by drain active lines, which may be top active lines 98 or bottom active lines 12.

As shown in FIG. 13, two pairs of vertical stacks of N field effect transistors have a respective symmetric configuration, and are electrically isolated from each other by a dielectric pillar structure 62. N is the total number of word lines in the first alternating stack (32A, 46A), which is the same as the total number of word lines in the second alternating stack (32B, 46B). A same drain line (e.g., bit line) connection to a drain pillar can be employed to access either vertical stack of N field effect transistors. Selection among the N first electrically conductive layers 46A (which are the first N word lines) and the N second electrically conductive layers 46B (which are the second N word lines) determines which of the field effect transistors among the 2N field effect transistors is activated. Thus, each vertical stack of N field effect transistors can be configured as a NOR string, and the two pairs of vertical stacks of N field effect transistors can be configured as two independent NOR strings of N field effect transistors.

Referring to all drawings and according to various embodiments of the present disclosure, a three-dimensional memory device includes a first vertically alternating stack (32A, 46A) of first insulating layers 32A and first electrically conductive layers 46A located over a substrate 4, and a laterally alternating sequence of active region pillars (61, 63) and memory stack structures (54, 56, 60) which extends vertically through the first vertically alternating stack. The laterally alternating sequence is electrically isolated from the first electrically conductive layers 46A by a respective blocking dielectric layer (e.g., backside blocking dielectric layer 44) at each level of the first electrically conductive layers 46A. Each of the memory stack structures (54, 56, 60) comprises a memory film 50 and a semiconductor channel material portion 60 that vertically extend at least from a bottommost one of the first electrically conductive layers 46A to a topmost one of the first electrically conductive layers 46A and laterally extend from a sidewall of a first neighboring active region pillar (61 or 63) to a sidewall of a second neighboring active region pillar (63 or 61).

In one embodiment, each of the active region pillars (61, 63) vertically extends from a bottommost one of the first electrically conductive layers 46A to a topmost one of the first electrically conductive layers 46A. In one embodiment, each memory film 50 comprises a lateral stack including a charge storage layer 54 and a tunneling dielectric 56 that contacts a respective semiconductor channel material portion 60.

In one embodiment, the three-dimensional memory device has a NOR circuit configuration. Each memory cell 55 of the three-dimensional memory device comprises a horizontal field effect transistor. Each horizontal field effect transistor 55 comprises a control gate electrode which comprises a portion of one of the electrically conductive layers 46, a channel which comprises a part of the semiconductor channel material portion 60, a source region which comprises a portion of the first neighboring active region pillar (61 or 63), and a drain region which portions a portion of the second neighboring active region pillar (63 or 61).

In one embodiment, each memory film (54, 56) includes a horizontally-extending memory film portion underlying a bottom surface of the bottommost one of the first electrically conductive layers 46A and a pair of vertically-extending memory film portions adjoined to a respective edge of the horizontally-extending memory film portion and vertically extending to the topmost one of the first electrically conductive layers 46A. The semiconductor channel material portion 60 includes a horizontally-extending semiconductor material portion overlying the horizontally-extending memory film and a pair of vertically-extending semiconductor material portions adjoined to a respective edge of the horizontally-extending semiconductor material portion and vertically extending to the topmost one of the first electrically conductive layers 46A.

In one embodiment, a dielectric pillar structure 62 is located between the vertically-extending semiconductor material portions of each semiconductor channel material portion 60. Interfaces between the active region pillars (61, 63) and the memory stack structures (54, 56, 60) are vertical. Interfaces between the dielectric pillar structure 62 and the active region pillars (61, 63) are vertical.

The three-dimensional memory device can further comprise a second vertically alternating stack of second insulating layers 32B and second electrically conductive layers 46B located over the substrate 4. Each of the second electrically conductive layers 46B is located at a same level as a respective one of the first electrically conductive layers 46A. Each of the second insulating layers 32B is located at a same level as a respective one of the first insulating layers 32A. Each of the second electrically conductive layers 46B is laterally spaced from each of the memory films (54, 56) by a respective additional backside blocking dielectric layer 44.

In one embodiment, the active region pillars (61, 63) and memory stack structures (54, 56, 60) alternate along a first horizontal direction hd1. Each of the first electrically conductive layers 46A and the backside blocking dielectric layers 44 laterally extend along the first horizontal direction hd1 with a laterally alternating sequence of planar sidewalls and curved sidewalls. Each of the backside blocking dielectric layers 44 contacts outer sidewalls of each of the memory films (54, 56) within the laterally alternating sequence.

In one embodiment, each of the memory stack structures (54, 56, 60) has a first width w1 along a second horizontal direction hd2 that is perpendicular to the first horizontal direction hd1, and each of the active region pillars (61, 63) has a second width w2 along the second horizontal direction hd2 that is greater than the first width w1.

In one embodiment, the three-dimensional memory device further comprises additional laterally alternating sequences of respective additional active region pillars (61, 63) and respective additional memory stack structures (54, 56, 60) that alternate along the first horizontal direction hd1, wherein the laterally alternating sequence and the additional laterally alternating sequences are laterally spaced among one another along a second horizontal direction hd2 that is perpendicular to the first horizontal direction hd1. The first vertically alternating stack (32A, 46A) and the second vertically alternating stack (32B, 42B) have an interdigitated configuration in which fingers of the first vertically alternating stack (32A, 46A) and fingers of the second vertically alternating stack (32B, 46B) alternately extend along the first horizontal direction hd1 between each neighboring pair among the laterally alternating sequence and the additional laterally alternating sequences. A first vertically-extending memory film portion of each memory film (54, 56) within the laterally alternating sequence and the additional laterally alternating sequences is located proximal to the first electrically conductive layers 46A and contacts the blocking dielectric layers 44, and a second vertically-extending memory film portion of each memory film (54, 56) within the laterally alternating sequence and the additional laterally alternating sequences is located proximal to the second electrically conductive layers 46B and contacts the additional blocking dielectric layers 44.

In one embodiment, each of the memory stack structures (54, 56) contacts each of the backside blocking dielectric layers 44 within a flat vertical plane including sidewalls of the memory films (54, 56), and each of the active region pillars (61, 63) has a convex vertical surface that contacts a respective concave vertical surface of each of the backside blocking dielectric layers 44.

In one embodiment, the active region pillars (61, 63) comprise an alternating sequence of source pillars and drain pillars, and each memory stack structure (54, 56, 60) includes a first sidewall that contacts a respective one of the source pillars and a second sidewall that contacts a respective one of the drain pillars. The source pillars and the drain pillars have a doping of a first conductivity type at a same dopant concentration, and the semiconductor channel material portions 60 have a doping of a second conductivity type that is the opposite of the first conductivity type.

In one embodiment, the three-dimensional memory device further comprises source lines (12 or 98) electrically shorted to a respective one of the source pillars (61 or 63); and drain lines (98 or 12) electrically shorted to a respective one of the drain pillars (63 or 61). The three-dimensional memory device can have a configuration selected from a first configuration in which the source lines 98 overlie the first vertically alternating stack (32A, 46A) and the laterally alternating sequence and the drain lines 12 underlie the first vertically alternating stack (32A, 46A) and the laterally alternating sequence, and a second configuration in which the drain lines 98 overlie the first vertically alternating stack (32A, 46A) and the laterally alternating sequence and the source lines 12 underlie the first vertically alternating stack (32A, 46A) and the laterally alternating sequence.

Various embodiments of the present disclosure provide a NOR-type three-dimensional memory device in which the memory cells 55 are electrically connected directly to a source region and a drain region without intermediate electrical connections through other memory cells that impede the operation speed of the memory cells. In other words, each memory cell 55 is a field effect transistor that contains its own doped source and drain regions in addition to a charge storage region. The memory cells (i.e., field effect transistors) 55 are horizontally separated from the neighboring memory cells by the various trenches filled with the above described materials, and are vertically separated from the neighboring memory cells by the insulating layers 32.

The electrical current flows between a neighboring pair of a source pillar and a drain pillar along a portion of a semiconductor channel material portion 60. Thus, the effective width of each transistor is the height (i.e., the thickness) of a word line, which is the thickness of a respective electrically conductive layer 46. The length of the transistor (i.e., the distance through which charge carriers travel between a source pillar and a drain pillar) is the lateral distance between the pair of the source region and the drain region, i.e., the lateral dimension of a memory stack structure (54, 56, 60) along the first horizontal direction hd1. The width to length ratio of the transistors in the three-dimensional memory device of the embodiments of the present disclosure is orders of magnitude greater than the width to length ratio of transistors in NAND architecture.

One advantage of the device of the embodiments of the present disclosure is that the shapes of the line trenches 39 and the active region openings (491, 492) renders the device relatively insensitive to overlay shifts during lithographic processing steps. The three-dimensional memory device of the embodiments of the present disclosure can significantly increase the bit density with little impact to the processing cost. The three-dimensional memory device of the embodiments of the present disclosure can provide shorter programming time with less power consumption during programming compared to prior art NAND devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming a vertically alternating sequence of continuous insulating layers and continuous sacrificial material layers;
   forming a plurality of line trenches laterally extending along a first horizontal direction through the vertically alternating sequence;
   forming a line trench fill structure within each of the line trenches by sequentially forming a charge storage layer, a semiconductor channel layer, and a dielectric core within each of the line trenches;
   dividing each line trench fill structure into a respective row of memory stack structures by forming active region openings therethrough;
   forming active region pillars in the active region opening by depositing a doped semiconductor material therein, wherein a plurality of laterally alternating sequences of active region pillars and memory stack structures are formed, each memory stack structure comprising a remaining portion of the line trench fill structures;
   forming backside recesses by removing the sacrificial material layers selective to insulating layers, the memory stack structures, and the active region pillars; and
   depositing electrically conductive layers in remaining volumes of the backside recesses.

2. The method of claim 1, further comprising depositing a blocking dielectric layer in the backside recesses, wherein the electrically conductive layers are deposited in the remaining volumes of the backside recesses on the blocking dielectric layer.

3. The method of claim 2, wherein:
   active region openings include first-type active region openings that cut through only a respective one of the line trench fill structures and second-type active region openings that cut through end regions of a respective neighboring pair of the line trench fill structures;
   each of the plurality of line trenches has a uniform first width along a second horizontal direction between a respective pair of parallel sidewalls that extend along the first horizontal direction, the second horizontal direction being perpendicular to the first horizontal direction;
   the first-type active region openings have a second width along the second horizontal direction and intersects a pair of parallel sidewalls of a respective one of the line trenches;
   the second-type active region openings have a third width that is greater than a sum of a spacing between a neighboring pair of line trenches and twice the first width;
   at least three active region openings cuts through each of the plurality of line trenches; and
   each of the active region openings has a pair of straight sidewalls that extend along the second horizontal direction and having a width that is at least the first width.

4. The method of claim 2, wherein:
   the active region openings divide the vertically alternating sequence of the continuous insulating layers and the continuous sacrificial material layers into a first in-process vertically alternating stack of first insulating layers and first sacrificial material layers, and a second in-process vertically alternating stack of second insulating layers and second sacrificial material layers; and
   each of the first and second insulating layers is a patterned portion of the continuous insulating layers, and each of the first and second sacrificial material layers is a patterned portion of the continuous sacrificial material layers.

5. The method of claim 4, wherein:

the electrically conductive layers comprise first electrically conductive layers formed between vertically neighboring pairs of the first insulating layers and second electrically conductive layers formed between neighboring pairs of the second insulating layers;

the first insulating layers and the first electrically conductive layers constitute a first vertically alternating stack, and the second insulating layers and the second electrically conductive layers constitute a second vertically alternating stack; and the first vertically alternating stack and the second vertically alternating stack have an interdigitated configuration in which fingers of the first vertically alternating stack and fingers of the second vertically alternating stack alternately extend along the first horizontal direction between each neighboring pair among the plurality of laterally alternating sequences.

6. The method of claim 2, wherein:

each of the memory stack structures comprises a memory film and a semiconductor channel material portion that vertically extend at least from a bottommost one of the first electrically conductive layers to a topmost one of the first electrically conductive layers and laterally extend from a sidewall of a first neighboring active region pillar to a sidewalls of a second neighboring active region pillar;

each of the active region pillars vertically extends from a bottommost one of the electrically conductive layers to a topmost one of the electrically conductive layers; and each memory film comprises a lateral stack including a blocking dielectric, a charge storage layer, and a tunneling dielectric that contacts a respective semiconductor channel material portion.

7. The method of claim 1, wherein:

each dielectric core is divided into a respective plurality of dielectric pillar structures upon formation of the active region openings;

each dielectric pillar structure is formed between a pair of vertically-extending semiconductor material portions of a respective semiconductor channel material portion and overlies a horizontally-extending semiconductor material portion of the respective semiconductor channel material portion;

interfaces between the active region pillars and the memory stack structures are vertical; and interfaces between the dielectric pillar structure and the active region pillars are vertical.

8. The method of claim 1, wherein:

active region pillars within each laterally alternating sequence of active region pillars and memory stack structures comprise an alternating sequence of source pillars and drain pillars;

each memory stack structure includes a first sidewall that contacts a respective one of the source pillars and a second sidewall that contacts a respective one of the drain pillars;

the source pillars and the drain pillars have a doping of a first conductivity type at a same dopant concentration;

the semiconductor channel material portions have a doping of a second conductivity type that is the opposite of the first conductivity type; and further comprising forming source lines electrically shorted to a respective one of the source pillars, and forming drain lines electrically shorted to a respective one of the drain pillars.

\* \* \* \* \*